United States Patent
Billet et al.

(12) United States Patent (10) Patent No.: US 10,034,417 B2
Billet et al. (45) Date of Patent: Jul. 24, 2018

(54) SYSTEM AND METHODS FOR SIMULATION-BASED OPTIMIZATION OF DATA CENTER COOLING EQUIPMENT

(71) Applicant: SCHNEIDER ELECTRIC IT CORPORATION, West Kingston, RI (US)

(72) Inventors: Laurent Billet, Somerville, MA (US); Christopher M. Healey, Tewksbury, MA (US); Jean-Louis Bergerand, Saint-Martin-d'heres (FR); Claude Le Pape-Gardeux, Grenoble (FR); James William VanGilder, Pepperell, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 251 days.

(21) Appl. No.: 15/017,771

(22) Filed: Feb. 8, 2016

(65) Prior Publication Data
US 2016/0234972 A1 Aug. 11, 2016

Related U.S. Application Data

(60) Provisional application No. 62/113,729, filed on Feb. 9, 2015.

(51) Int. Cl.
G05D 23/00 (2006.01)
G05D 7/00 (2006.01)
H05K 7/20 (2006.01)

(52) U.S. Cl.
CPC ..... H05K 7/20836 (2013.01); H05K 7/20745 (2013.01)

(58) Field of Classification Search
CPC .................................................. F24F 11/0086
USPC ........................................................ 700/276
See application file for complete search history.

(56) References Cited

U.S. PATENT DOCUMENTS

| | | | |
|---|---|---|---|
| 7,991,592 B2 | 8/2011 | VanGilder et al. | |
| 8,209,056 B2 | 6/2012 | Rasmussen et al. | |
| 8,825,451 B2 | 9/2014 | VanGilder et al. | |
| 8,842,433 B2* | 9/2014 | Koblenz | G05D 23/1917 |
| | | | 361/679.47 |
| 8,972,217 B2 | 3/2015 | VanGilder et al. | |
| 9,476,657 B1* | 10/2016 | Pettis | H05K 7/208 |

(Continued)

OTHER PUBLICATIONS

Demetriou, Dustin W. et al., "Energy Modeling of Air-Cooled Data Centers: Part I The Optimization of Enclosed Aisle Configurations," Proceedings of the ASME 2011 Pacific Rim Technical Conference & Exposition on Packaging and Integration of Electronic and Photonic Systems, InterPACK2011, Jul. 6-8, 2011, Portland, Oregon, USA, IPACK2011-52003, pp. 1-10.

(Continued)

*Primary Examiner* — Suresh Suryawanshi
(74) *Attorney, Agent, or Firm* — Lando & Anastasi, LLP

(57) ABSTRACT

Aspects of this disclosure are directed to a simulation-based cooling optimization method that provides real-time cooling set points in a data center. The method combines airflow and temperature simulation, energy modeling, and an optimization solver to determine optimal cooling set point values for a data center. Other aspects are also directed to estimating power consumption and cost and energy savings.

18 Claims, 13 Drawing Sheets

(56) References Cited

U.S. PATENT DOCUMENTS

| | | | |
|---|---|---|---|
| 9,554,491 B1* | 1/2017 | Wong | F25B 21/02 |
| 9,830,410 B2* | 11/2017 | VanGilder | G06F 17/5009 |
| 2009/0112522 A1 | 4/2009 | Rasmussen | |
| 2012/0059628 A1 | 3/2012 | VanGilder et al. | |
| 2012/0071992 A1 | 3/2012 | VanGilder et al. | |
| 2012/0245905 A1 | 9/2012 | Dalgas et al. | |
| 2013/0197895 A1 | 8/2013 | Wang et al. | |
| 2013/0233532 A1* | 9/2013 | Imwalle | F28F 27/02 |
| | | | 165/287 |
| 2014/0121843 A1 | 5/2014 | Federspiel et al. | |
| 2014/0122033 A1 | 5/2014 | VanGilder et al. | |
| 2014/0190681 A1* | 7/2014 | Chainer | H05K 7/20836 |
| | | | 165/289 |
| 2014/0371920 A1 | 12/2014 | Varadi | |
| 2016/0187397 A1 | 6/2016 | VanGilder | |
| 2017/0023992 A1* | 1/2017 | Singh | G06F 1/20 |

OTHER PUBLICATIONS

Demetriou, Dustin W. et al., "Energy Modeling of Air-Cooled Data Centers: Part II The Effect of Recirculation on the Energy Optimization of Open-Aisle, Air-Cooled Data Centers," Proceedings of the ASME 2011 Pacific Rim Technical Conference & Exposition on Packaging and Integration of Electronic and Photonic Systems, InterPACK2011, Jul. 6-8, 2011, Portland, Oregon, USA, IPACK2011-52004, pp. 1-10.

Notification of Transmittal of the International Search Report and the Written Opinion of the International Searching Authority from Corresponding PCT/US2016/016930 dated Apr. 19, 2016.

Rasmussen, Neil "Electrical Efficiency Modeling of Data Centers," White Paper #113, Revision 2, Schneider Electric—Data Center Science Center, 2011, pp. 1-17.

Wachter, Andreas, An Interior Point Algorithm for Large-Scale Nonlinear Optimization with Applications in Process Engineering—A Dissertation Submitted to the Graduate School in Partial Fulfillment of the Requirements for the degree of Doctor of Philosophy in Chemical Engineering, Carnegie Mellon University, Pittsburgh, Pennsylvania, Jan. 29, 2002, pp. 1-241.

Zhang, Xuanhang (Simon) et al., "A Real-Time Data Center Airflow and Energy Assessment Tool," Proceedings of IPACK2009, InterPACK'09, Jul. 19-23, 2009, San Francisco, California, USA, IPACK2009-89175, pp. 1-6.

* cited by examiner

SYSTEM AND METHODS FOR SIMULATION-BASED OPTIMIZATION OF DATA CENTER COOLING EQUIPMENT

CROSS-REFERENCE TO RELATED APPLICATIONS

This application claims priority under 35 U.S.C. § 119(e) to U.S. Provisional Application Ser. No. 62/113,729, titled SYSTEM AND METHODS FOR SIMULATION-BASED OPTIMIZATION OF DATA CENTER COOLING EQUIPMENT, filed Feb. 9, 2015, herein incorporated by reference in its entirety.

BACKGROUND

Technical Field

The technical field relates generally to managing data center cooling equipment.

Background Discussion

Cooling consumes a large part of energy expenditures for data centers. This creates a need to allocate cooling within a data center as efficiently as possible. To reach this goal, many data center operators rely on sensors to adjust cooling to achieve adequate temperatures for servers and racks. However, these sensor-based systems may only provide temperature estimates in areas of the data centers where sensors are located. Further, these methods often fail to provide a sophisticated approach to evaluating and classifying the sensor data. For instance, sensor-based systems may incorrectly incorporate or use aberrant sensor readings, and/or fail to alert the user of problems related to issues related to airflow, such as air blockage or missing blanking panels.

SUMMARY

Aspects and embodiments are directed to a simulation-based optimization method and system for controlling data center cooling equipment that combines the use of an airflow and temperature numerical simulation, an energy model, and an optimization solver for the purposes of determining at least one optimal cooling set point, an estimated power consumption, and estimated cost and energy savings. The optimization method and system is also capable of minimizing cooling equipment energy consumption while still maintaining inlet temperatures to equipment racks within a desired range. The optimization method and system also includes several techniques that make it useful for applications requiring real-time control. The methods and systems disclosed herein include a variance reduction technique that reduces the noise of the simulation and allows the optimization to run more efficiently, an automatic calibration technique that matches the simulation to the current state of the data center, and a regression model that is tuned by simulation that may be used by the optimization solver that functions to reduce the overall time to find the optimal set points.

A first aspect of the invention is directed to a method for optimizing cooling power consumption in a data center that includes a plurality of racks and at least one cooling unit. The method includes receiving information regarding the data center, including a layout of the plurality of racks and the at least one cooling unit within the data center, determining an initial power consumption value for the data center by implementing an energy model, predicting at least one of a temperature value and an airflow rate value by implementing a numerical simulation model, determining at least one optimal cooling set point value for the at least one cooler using an optimization solver based on the initial power consumption value and the at least one predicted value, the optimization solver minimizing a power consumption value of a power consumption function while maintaining at least one constraint associated with operation of the at least one cooling unit, and controlling operation of the at least one cooling unit using the at least one optimal cooling set point value.

The method may further include defining the at least one constraint, wherein the at least one constraint comprises maximum and minimum airflow rate values for the at least one cooler, maximum and minimum supply temperature values for the at least one cooler, and a maximum inlet temperature for each rack of the plurality of racks. According to a further aspect, the optimization solver iteratively determines the at least one optimized cooling set point until a stopping condition is met by iteratively varying one or more inputs received by at least one of the energy model and the numerical simulation model.

The method may further include reducing a number of iterations by averaging at least one input received by at least one of the energy model and the numerical simulation model.

According to another aspect, the method may further include dividing a representation of the data center into a computational grid comprising a plurality of grid cells, and determining an inlet temperature value for at least one grid cell of the plurality of grid cells, wherein the inlet temperature value is associated with an inlet temperature of at least one rack of the plurality of racks.

The method may further include determining a lowest value for an inlet temperature value for the plurality of racks in each iteration, averaging the lowest value associated with each iteration over the number of iterations to determine an average minimum inlet temperature for the plurality of racks, determining a highest value for an inlet temperature for the plurality of racks in each iteration, averaging the highest value associated with each iteration over the number of iterations to determine an average maximum inlet temperature for the plurality of racks, wherein the at least one constraint includes the average minimum inlet temperature for the plurality of racks and the constraint associated with the maximum inlet temperature for each rack is replaced by the average maximum inlet temperature for the plurality of racks.

According to another aspect, the method further includes calculating an airflow velocity value and a temperature value for at least one grid cell, wherein the inlet temperature value is based on the airflow velocity value and the temperature value. According to a further aspect, the airflow velocity value and the temperature value are calculated using a potential flow method.

In accordance with various aspects, the received information includes at least one real-time measurement value including at least one of rack power, rack airflow, cooler airflow, supply temperature of a cooler, and an outside temperature value, and the one or more inputs includes the at least one real-time measurement value.

According to another aspect, the method further includes statistically tuning at least one of the energy model and the numerical simulation model.

According to certain aspects, implementing the numerical simulation model includes generating a regression model, the regression model based at least in part on at least one operating parameter of the data center, including a total load of the plurality of racks, an air ratio, and a supply temperature of the at least one cooler. According to a further aspect, the regression model is generated using a least square regression technique. According to a further aspect, the regression model is based on a set of coefficients to predict a maximum inlet temperature to the plurality of racks. According to yet a further aspect, the regression model is based on at least one of simulation results and one or more measurements. The one or more measurements may be obtained from one or more sensors positioned in the data center.

According to some aspects, the stopping condition comprises one or more of a number of iterations, iteration convergence, or an amount of computation time. According to one aspect, the stopping condition is met when the at least one optimized cooling set point value is within a predetermined tolerance of an error threshold.

According to another aspect, the optimization solver is one of a deterministic method or a stochastic method. According to a further aspect, the optimization solver is a derivative-based deterministic method.

According to at least one aspect, the method includes adjusting the at least one optimal cooling set point to reduce power consumption of the at least one cooling unit. According to another aspect, the optimal cooling set point value is at least one of an airflow rate and a supply temperature for the at least one cooling unit.

In accordance with some aspect, the received information includes at least one airflow rate measurement within the data center, and at least one temperature measurement within the data center, and implementing the numerical simulation model includes utilizing the layout information, the at least one airflow rate measurement, and the at least one temperature measurement. According to another aspect, the at least one airflow rate includes an airflow rate of the at least one cooling unit and the at least one temperature is a supply temperature of the at least one cooling unit. According to some aspects, the numerical simulation model is based on a computational fluid dynamics (CFD) simulation method.

According to another aspect, the received information includes at least one power measurement, including at least one of a total power load of the plurality of racks and a power load of the at least one cooling unit, and implementing the energy model includes utilizing the at least one power measurement. According to a further aspect, the received information further includes data related to climate associated with a geographic location of the data center, and the energy model utilizes the data related to climate.

According to some aspect, the method includes identifying devices in the data center that use power, and associating at least one loss parameter to each device, wherein the energy model includes an aggregation of the least one loss parameter associated with each device.

Another aspect of the invention is directed to system for optimizing cooling power consumption in a data center that includes a plurality of racks and at least one cooling unit. The system includes at least one input configured to receive information regarding the data center, including a layout of the plurality of racks and the at least one cooling unit within the data center, a programmable device in communication with the at least one input, the programmable device comprising: a memory for storing the received information, at least one processor coupled to the memory and configured to: determine an initial power consumption value for the data center by implementing an energy model, predict at least one of a temperature value and an airflow rate value by implementing a numerical simulation model, determine at least one optimal cooling set point value for the at least one cooler using an optimization solver based on the initial power consumption value and the at least one predicted value, the optimization solver minimizing a power consumption value of a power consumption function while maintaining at least one constraint associated with operation of the at least one cooling unit, and control operation of the at least one cooling unit using the at least one optimal cooling set point value.

According to certain aspects, the at least one constraint comprises maximum and minimum airflow rate values for the at least one cooler, maximum and minimum supply temperature values for the at least one cooler, and a maximum inlet temperature for each rack of the plurality of racks.

According to a further aspect, the at least one processor is configured to use the optimization solver by iteratively determining the at least one optimized cooling set point until a stopping condition is met by iteratively varying one or more inputs used by at least one of the energy model and the numerical simulation model. According to another aspect, the at least one processor is configured to: divide a representation of the data center into a computational grid comprising a plurality of grid cells, determine an inlet temperature value for at least one grid cell of the plurality of grid cells, wherein the inlet temperature value is associated with an inlet temperature of at least one rack of the plurality of racks.

According to a further aspect, the at least one processor is configured to: determine a lowest value for an inlet temperature value for the plurality of racks in each iteration, average the lowest value associated with each iteration over the number of iterations to determine an average minimum inlet temperature for the plurality of racks, determine a highest value for an inlet temperature for the plurality of racks in each iteration, and average the highest value associated with each iteration over the number of iterations to determine an average maximum inlet temperature for the plurality of racks, wherein the at least one constraint includes the average minimum inlet temperature for the plurality of racks and the constraint associated with the maximum inlet temperature for each rack is replaced by the average maximum inlet temperature for the plurality of racks.

According to another aspect, the at least one processor is configured to statistically tune at least one of the energy model and the numerical simulation model.

According to yet another aspect, the at least one processor is configured to implement the numerical simulation model by generating a regression model, the regression model based at least in part on at least one operating parameter of the data center, including a total load of the plurality of racks, an air ratio, and a supply temperature of the at least one cooler.

Still other aspects, embodiments, and advantages of these example aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Embodiments disclosed herein may be combined with other embodiments, and references to "an embodiment," "an example," "some embodiments," "some examples," "an alternate embodiment," "various embodiments," "one embodiment," "at least one embodiment," "this and other embodiments," "certain embodiments," or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
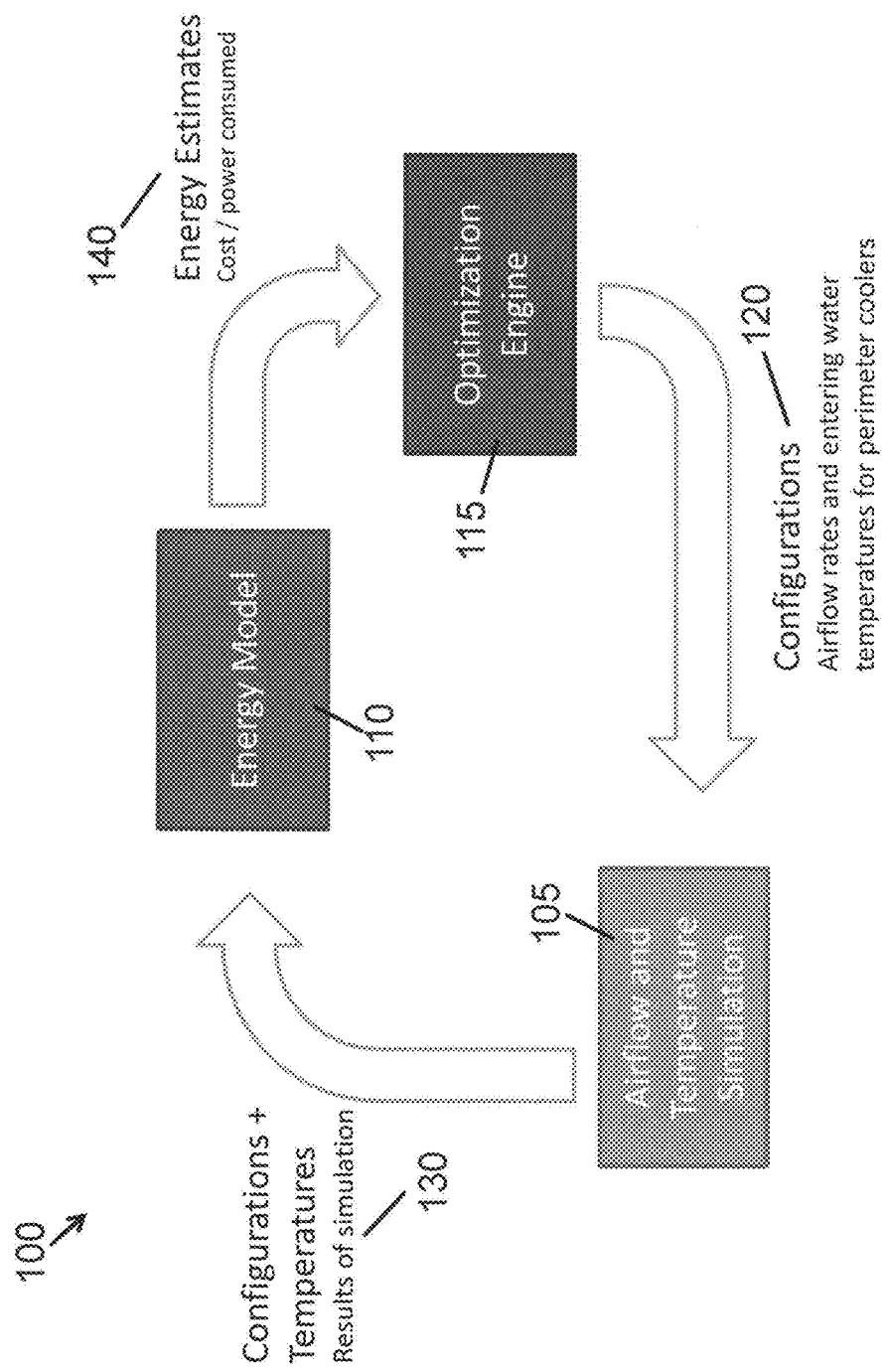
FIG. 1 is a flow diagram of an optimization method according to one or more aspects of the disclosure.

Many control schemes for data centers are based on placing a limited number of sensors within the facility and then employing heuristic strategies to achieve cooling airflow and temperature control. However, these methods are limited in that they often fail to cover every server in the facility, and there is no guarantee that the control scheme is actually efficient. Simulation-based control methods have not typically been used for controlling data centers for a number of reasons. For example, many facilities lack operators having the experience and expertise to create a robust optimization scheme. In addition, the facility may lack an interface that is capable of obtaining real-time data from the environment being controlled, and the simulation method may also lack the speed with which to provide information about the data center. There may also not be an adequate method for dealing with the error and noise that is inherent to many simulation-based techniques. Numerical simulation processes are in fact inherently noisy and in order to estimate critical values, the optimization algorithm may have to run multiple simulations. For example, finite difference numerical analysis techniques run several simulations with very slightly perturbed parameters, and then choose a direction that both improves the objective and satisfies any constraints on the system. However, noisy simulations may incorrectly direct the simulation into choosing the wrong direction, since at small ranges the value produced from any one simulation may not be consistent with a general trend. This adversely affects the simulation and introduces inefficiencies.

Optimization results are typically only as good as the simulation that provides the temperature and airflow estimates. Common sources of error include input error, where input parameters such as rack power or airflow reflect values that are not consistent with reality, modeling error, where the simulation only approximately captures the tendencies of the objects and fails to capture characteristics such as physical geometric details, and solver error and noise, where the airflow simulation is approximate and therefore subject to numerical error, discretization error, and other issues.

Aspects of this disclosure relate to a simulation-based cooling optimization method and system that addresses one or more of the issues discussed above. The methods and systems disclosed herein provide real-time energy assessment and optimization in a data center by combining airflow and temperature simulation, energy modeling, and an optimization solver. For example, the methods and systems disclosed herein may provide real-time cooling set points in a data center, such as by adjusting the supply temperature and airflow of a cooling unit to reduce power consumption of the cooling unit. The methods and systems disclosed herein are capable of utilizing real-time input data, such as power, airflow, and temperature values, and providing a robust temperature analysis and prediction, as well as optimal temperature and airflow set points for the purposes of efficiently cooling not only full scale data centers, but also containerized data centers, general building heating and cooling, electronics cooling, and other temperature-critical applications.

The methods and systems implementing the methods disclosed herein may be used in a number of different ways. For example, during an evaluation or audit, an optimization may be performed for the purposes of finding potential areas for cost and/or energy savings. In addition, data center management may be implemented by performing optimizations at one or more time intervals for the purposes of evaluating and potentially adjusting one or more parameters related to cooling, such as temperature and airflow set points for the cooling units. Further, the methods and systems may also be used to predict energy usage, such as by incorporating an outside temperature, a future load, and/or a future load distribution.

According to another aspect, embodiments of the optimization methods disclosed herein may further be used in sales or audit-based applications for the purposes of giving relatively quick estimates related to energy and cost savings. In certain instances, this approach may also be capable of providing efficient or otherwise optimal set points for cooling units based on input loads and predicted outside temperatures.

The simulation-based optimization methods and systems discussed herein may be combined with sensor data to provide several advantages over systems equipped with only a sensor-based control scheme. For example, simulations may provide temperature estimates for all areas of the data center, not just areas where sensors are located. Further, the simulations may provide airflow data, which is one of the main contributors to thermal performance. In addition, simulations may react in real-time to changes in input data, such as server power, server airflow rates, and CRAC airflow rates. The simulations may also be used to evaluate and classify sensor data. For example, the simulation-based systems may be capable of identifying aberrant sensor readings and temporary issues, such as blocked airflow and missing blanking panels. The simulation-based methods may additionally be capable of providing good predictive ability in situations where there is little or no historical data, such as in instances where a server workload has changed, during virtualization exercises, or in situations where there are changes made in the configuration of the data center. Thus, there is little or no need to "train" the models.

The aspects disclosed herein in accordance with the present invention, are not limited in their application to the details of construction and the arrangement of components set forth in the following description or illustrated in the accompanying drawings. These aspects are capable of assuming other embodiments and of being practiced or of being carried out in various ways. Examples of specific implementations are provided herein for illustrative purposes only and are not intended to be limiting. In particular, acts, components, elements, and features discussed in connection with any one or more embodiments are not intended to be excluded from a similar role in any other embodiments.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls. Moreover, titles or subtitles may be used in the specification for the convenience of a reader, which shall have no influence on the scope of the present invention.

FIG. 1 presents a flow diagram of a simulation-based optimization process, generally indicated at 100, that may be implemented according to one or more aspects of the disclosure. The process links together three main components, an airflow and temperature simulation module 105, an energy model 110, and an optimization engine or solver 115. The airflow and temperature simulation module 105 may be used for predicting the temperatures at each point of a room or space for a given control set point and at a given IT load.

The energy model 110 may be used for determining cooling energy consumption estimates for a given control set point and in certain instances, a given outside temperature. The optimization engine 115 uses the simulation module 105 and the energy model 110 in an iterative process that converges to an optimal set point. The optimization process may begin by generating room configurations and equipment set points 120, for example, by importing or otherwise obtaining one or more input parameters that correspond to this information. This data is then used in the simulation module 105 that estimates airflow and temperature values 130 for the cooling unit. These airflow and temperature values 130 are then used in the energy model 110 to generates energy consumption estimates 140, which may then be fed back into the optimization engine 115 for evaluation of additional alternatives, with the goal of minimizing the total power consumption of the cooling system and while still operating within certain operating constraints. According to at least one embodiment, the optimization process 100 provides supply temperature and airflow rate values for one or more cooling units, such as computer room air handlers (CRAHs), that are included in the data center of interest. For instance, the optimization process may converge to an optimal set point that corresponds to the control set point and includes the airflow of each cooling unit within the data center and the chilled water temperature.

Energy Model

According to various aspects, the cooling energy usage model 110 is used to estimate energy consumption 140 based on the results from the airflow and temperature simulation 105. According to some embodiments, the energy model 110 may be used to determine the energy consumption for a given control set point and a given outside temperature. In certain embodiments, the energy model may be provided or configured to calculate a load in Watts and to generate an energy consumption rate or value. Many types of energy models may be used, including models based on Data Center Environmental Assessment (DCEA). Non-limiting examples of energy models that are suitable for the optimization process disclosed herein include the efficiency model described in U.S. patent application Ser. No. 12/260,448, which includes a five-parameter model, and the three-parameter models described in "Electrical Efficiency Modeling for Data Centers," APC White Paper 113 v2 (2011), and U.S. patent application Ser. No. 14/586,815, the entire disclosures of which are incorporated herein by reference. Energy models are also discussed in "Energy Modeling of Air-Cooled Data Centers: Part I—The Optimization of Enclosed Aisle Configurations" (Proceedings of the 2011 InterPACK Conference) and "Energy Modeling of Air-Cooled Data Centers: Part II—The Effect of Recirculation on the Energy Optimization of Open-Aisle, Air-Cooled Data Centers" (Proceedings of the 2011 InterPACK Conference), each of which is incorporated by reference in its entirety.

In accordance with various embodiments, the energy model 110 may include a computer simulation of the energy consumption of the data center. In certain instances, the model may include one or more of the energy flow dependencies and interconnections as well as models for the various power and cooling devices. A simulation using the model may take inputs, such as outdoor temperature, IT load, cooling architecture, and operator settings, and determine one or more of the energy flows in one or more circuits in the data center. The energy model 110 may be configured to address energy flows, which may be in the form of electrical power flow through wires, or may be heat flows through water pipes or through air. All of these are energy flows that may be accounted for in the model. Certain devices, like IT loads, consume electrical energy and make heat. Other devices, like transformers and UPSs, transform electrical energy with some heat generation (loss) as an undesirable byproduct. Other devices, like air conditioners, consume electrical energy and pump heat. The data center as a complete system (including the IT load) consumes electrical energy and makes heat that is exhausted to the outdoors.

One example of a three-parameter energy model that may be used in accordance with various aspects of this disclosure is expressed below according to Equation 1:

$$\frac{P_{loss}}{P_{nom}} = \alpha^{NL} + \alpha^{P}\left(\frac{P_{load}}{P_{nom}}\right) + \alpha^{S}\left(\frac{P_{load}}{P_{nom}}\right)^{2} \qquad \text{Equation 1}$$

where $P_{loss}$ is the total power consumption of the component (e.g., UPS, CRAH, chiller, etc.), $P_{nom}$ is the nominal power rating of the component (e.g., 250 kW UPS, 40 kW CRAH, etc.), $P_{load}$ is the current load on the device (e.g., IT load on a UPS, cooling power load on a CRAH, etc.), $\alpha^{NL}$ is the no-load loss coefficient, $\alpha^{P}$ is the proportional loss coefficient, and $\alpha^{S}$ is the square-law loss coefficient. The three-parameter model represented in Equation 1 takes into account three different types of device power consumption "losses." The no-load loss coefficient $\alpha^{NL}$ represents the power consumption of the component that is a fixed amount whenever the component is turned on, whereas the proportional loss coefficient $\alpha^{P}$ and the square-law loss coefficient $\alpha^{S}$ represent additional power consumption which increases with load. The device efficiency model shown in Equation 1 provides a load in Watts as input and generates a power consumption (or loss) rate as an output.

Table 1 below shows typical values of these three types of losses for various types of energy-consuming equipment typically used in a data center. The fixed loss (no-load), the loss proportional to the load (proportional), and the loss proportional to the square of the load (square-law) parameters may be expressed in percent of the nameplate, i.e., rated or nominal capacity. The losses are summed in the last column as the total loss for each component.

TABLE 1

Typical Electrical Losses of Data Center Components Expressed as a Fraction of Full Load Component Nominal Rating

| Energy-Consuming Component | No-load Loss | Proportional Loss | Square-Law Loss | Total Loss |
|---|---|---|---|---|
| UPS | 4% | 5% | — | 9% |
| PDU | 1.5% | — | 1.5% | 3% |
| Lighting | 1% | — | — | 1% |
| Wiring | — | — | 1% | 1% |
| Switchgear | — | — | 0.5% | 0.5% |
| Generator | 0.3% | — | — | 0.3% |
| CRAH | 8% | 0% | — | 8% |
| CRAC | 28% | 15% | — | 43% |
| Humidifier | 1% | 1% | — | 2% |
| Chiller | 6% | 26% | — | 32% |

According to various aspects, Equation 1 may be modified or otherwise adjusted to account for one or more factors that may affect electrical power consumption of cooling equipment. For example, the three-parameter model above for a CRAH typically includes only the first term, since these devices have historically operated at a fixed fan speed. However, with the increase in use of variable frequency drive (VFD) technology, the fan speed may be adjustable. Since fan power consumption scales with the cube of airflow rate, the no-load component of the three-parameter model of Equation 1 above may be extended to include a correction for fan speed and may be expressed according to Equation 2 below:

$$\frac{P_{loss}}{P_{nom}} = \alpha^{NL}\left(\frac{Q}{Q_{nom}}\right)^{3} \qquad \text{Equation 2}$$

where Q is the current operating airflow rate, and $Q_{nom}$ is the nominal (typically the maximum) airflow rate which is associated with the nominal power $P_{nom}$. In accordance with some embodiments, the no-load coefficient $\alpha^{NL}$ in Equation 2 may be an empirically determined value. Further, chillers generally require the first two terms of Equation 1 since chillers consume more power as the ambient temperature increases because the absolute temperature difference between the ambient and the chilled water ultimately supplied to the CRAHs increases. Consequently, the additional power consumption is driven according to Equation 3 below:

$$\Delta T_{air-water} = T^{amb} - T^{EW} \qquad \text{Equation 3:}$$

where $T^{amb}$ is the ambient air temperature and $T^{EW}$ is the water temperature entering the CRAHs (i.e., supplied to the building). In accordance with one or more embodiments, the power consumption of the chiller increases by a predetermined value for each degree Celsius (° C.) increase in $\Delta T_{air-water}$. Thus, the power consumption model of Equation 1 for chillers may be expanded according to Equation 4 below:

$$\frac{P_{loss}}{P_{nom}} = \alpha^{NL} + \alpha^{P}\left(\frac{P_{load}}{P_{nom}}\right)\{1 - C(\Delta T^{nom}_{air-water} - \Delta T^{load}_{air-water})\} \qquad \text{Equation 4}$$

where
$T_{air-water}^{nom} = \Delta T_{air-water}$ under nominal conditions (from which $\alpha^{NL}$ and $\alpha^{P}$ were determined) and $\Delta T_{air-water}^{load} = \Delta T_{air-water}$ under actual (operational) load conditions. According to certain embodiments, the constant "C" is an empirically determined constant.

A similar correction for power consumption losses may be made for ambient humidity (also referred to herein as relative humidity). Chiller systems that include cooling towers or other components in which evaporative cooling is used will consume more power as humidity increases. Analogous to the temperature adjustment discussed above with respect to Equation 4, the power consumption efficiency model of Equation 1 may be expanded according to Equation 5 below:

$$\frac{P_{loss}}{P_{nom}} = \alpha^{NL} + \alpha^{P}\left(\frac{P_{load}}{P_{nom}}\right)\{1 - D(RH^{nom} - RH^{load})\} \qquad \text{Equation 5}$$

where $RH^{nom}$ is the relative humidity under nominal conditions (from which $\alpha^{NL}$ and $\alpha^{P}$ were determined), and $RH^{load}$ is the relative humidity under actual (operational) conditions. The constant "D" may be determined empirically based on measured or published data and may be interpreted as the percentage increase in power consumption per percentage-point change in relative humidity. Thus, the constant D may be an empirically determined constant based on a mathematical relationship between the device's power consumption and the measured ambient humidity. Further, in accordance with some embodiments, the ambient humidity correction factor, i.e., $\{1-D(RH^{nom}-RH^{load})\}$ may be applied to the no-load loss and/or square-law loss parameter terms of Equation 1. Further, the correction may be based on humidity ratios, or wet bulb temperatures, instead of relative humidity.

According to at least one embodiment, the power consumption efficiency model for chillers may include corrections for both ambient temperature, i.e., Equation 4, and humidity, i.e., Equation 5, according to Equation 6 below:

$$\frac{P_{loss}}{P_{nom}} = \alpha^{NL} + \alpha^P \left(\frac{P_{load}}{P_{nom}}\right)$$

$$\{1 - C(\Delta T^{nom}_{air-water} - \Delta T^{load}_{air-water})\}\{1 - D(RH^{nom} - RH^{load})\}$$

Equation 6

In accordance with some embodiments, one or more of these corrections may be applied to the no-load loss and/or square-law loss parameter terms of Equation 1.

According to a further embodiment, the corrections discussed above that are applied to the three-parameter model of Equation 1 are not limited to the cooling units, e.g., CRAHs and CRACs, and chiller systems. For example, the corrections may also be used for any other data center infrastructure component that uses power and features fan-driven airflow, such as air-side economizers, UPS s, PDUs, and other electrical infrastructure, etc. According to another example, the corrections may also be used for any other component that rejects heat to the outside ambient environment, such as economizers. In addition, one or more of the components may include corrections for both the fan speed, e.g., Equation 2, and outside ambient conditions, e.g., Equations 4, 5, and/or 6.

Simulation Module

The simulation module 105 shown in FIG. 1 may be used for determining airflow and temperature estimates based on room configurations and equipment set points. For example, according to some embodiments, the airflow and temperature simulation 105 may be used to predict the temperatures at each point of the room for a given control set point, and/or at a given IT load. Non-limiting examples of suitable simulation methods and systems include those based on computational fluid dynamics (CFD) analysis, such as potential flow or RANS (Reynolds-Averaged Navier-Stokes) CFD, and alternatives to CFD, such as lumped models. Potential flow methods and systems are discussed in U.S. patent application Ser. Nos. 12/884,832, 13/194,570, and 13/665,749, and U.S. Pat. No. 8,825,451, the entire disclosures of which are incorporated herein by reference. One example of a model for conducting airflow and temperature analysis is discussed in U.S. Pat. No. 8,209,056, the entire disclosure of which is also incorporated herein by reference. In accordance with some embodiments, existing software applications, such as EcoStream™ software, available from Schneider Electric, Andover, Mass. may be used to model data center airflow.

According to some embodiments, the Potential Flow Method (PFM) may be used for determining airflow and temperature estimates. PFM is a physics-based technique that determines velocity potential and temperature in cells of a structured grid arrangement. This approach divides the physical problem space into a number of grid cells, which may form either a structured Cartesian grid, or an unstructured grid in two or three dimensions. Methods and systems for automatically generating an unstructured grid and further interpolating field values within the unstructured grid are discussed in the U.S. patent application Ser. No. 13/194,570. Airflow may enter or exit each side of the grid cell, and additional airflow may be added to or subtracted from the grid cell.

In summary, the PFM method idealizes the airflow as incompressible and irrotational, in which the flow field may be determined from Poisson's Equation expressed below as Equation 7:

$$\nabla^2 \varphi = S'''$$

Equation 7 where is a volumetric-flow-rate source per unit volume and ω is the velocity potential. The ω velocity potential is related to the x, y, and z components of velocity as expressed below by Equation 8:

$$u = \frac{\partial \varphi}{\partial x}$$

$$v = \frac{\partial \varphi}{\partial y}$$

$$w = \frac{\partial \varphi}{\partial z}$$

Equation 8

When discretized for numerical calculation on a computational grid, the velocity potential at any grid cell i can be written as Equation 9 below:

$$\varphi_i = \frac{1}{4}\left(\varphi_N + \varphi_S + \varphi_E + \varphi_W - \frac{S'''}{\Delta x}\right)$$

Equation 9

One such equation can be obtained for $\varphi_i$ at every grid cell and the entire set can be solved simultaneously. As discussed in the U.S. patent application Ser. No. 13/194,570, scalar values like velocity potential and temperature are computed at cell centers, while velocities are computed at cell faces. Once velocity potentials are determined, velocities may be determined from the appropriate form of Equation 8 written for a discretized computational grid.

No pressure calculations are needed in calculating airflow using PFM. However, a method for coupling pressure to the airflow prediction can be used to model certain flow boundary conditions, such as perforated tiles, that depend on pressure. One such method that uses the Bernoulli Equation is described in the U.S. patent application Ser. No. 12/884,832. Once the airflow velocities are determined, temperatures may be determined using Equation 10:

$$\vec{V} \cdot \nabla T = \alpha_t \nabla^2 T$$

Equation 10:

where $\alpha_t = k/(\rho c_p)$ is the thermal diffusivity. In practice, the diffusion term on the right-hand side of Equation 10 can be neglected in favor of the dominant convection terms; however, retaining the diffusion term adds the additional degree of freedom, $\alpha_t$, which could be "tuned" to affect the accuracy of the predictions from the PFM.

An enhanced PFM model is discussed in the U.S. patent application Ser. No. 13/665,749, and includes one or more corrective methods that may be added to the base PFM method, such as the jet model, the halo cell velocity method, and the buoyancy correction method. For example, jet-like flows may be associated with supply diffusers, free-standing racks, and other airflow suppliers, halo cells may be associated with thermally-driven buoyant plumes that surround solid objects, and buoyancy may be associated with cases of hot air rising to the top of the data center, and thus adds an additional velocity component to each internal grid cell.

According to some embodiments, another example for conducting airflow and temperature simulations is discussed in U.S. Pat. No. 8,972,217 (referred to herein as "the '217 patent") the entire disclosure of which is incorporated herein by reference. The '217 patent describes a method that relies on hot aisle and cold-aisle capture indices for determining temperature values in a data center. The cold-aisle capture index for a rack is defined in at least some embodiments as the fraction of air ingested by the rack which originates from local cooling resources (e.g., perforated floor tiles or local coolers). The hot-aisle capture index is defined as the fraction of air exhausted by a rack which is captured by local extracts (e.g., local coolers or return vents). The CI values may be determined as discussed in U.S. Pat. No. 7,991,592 (referred to herein as "the '592 patent"), which is incorporated herein by reference in its entirety. As explained in the '592 patent, the CI for each rack in a hot-aisle cluster can be computed as the fraction of the rack's airflow which is captured by all coolers within the rack's cluster. To track the airflow from each rack, one concentration species $C^i$ is used to individually identify the exhaust air from each rack. (An alternative approach would be to use a single species concentration and, instead, compute CI for only one rack at a time performing the computation as many times as needed to cover all racks in the cluster.) The fraction of air exhausted from rack i which is captured by cooler (or local extract) j is determined using Equation 11:

$$f_{ij} = \frac{C_j^i Q_j}{C_i^i Q_i} \quad \text{Equation 11}$$

where
$C_i^i$ is the concentration of species i prescribed at the exhaust or rack i
$C_j^i$ is the concentration of species i computed at the inlet of cooler j
$Q_i$ is the volumetric airflow rate through rack i
$Q_j$ is the volumetric airflow rate through cooler j
The capture index is the sum of the fractions of air exhausted from rack i which is captured by cooler j summed over all N local coolers, as shown below by Equation 12:

$$CI_i = \sum_{j=1}^{N} \frac{C_j^i Q_j}{C_i^i Q_i} \quad \text{Equation 12}$$

Since the numerical value of $C_i^i$ is arbitrary, it is convenient to set $C_i^i=1$ in the numerical analysis, making the capture index as shown below by Equation 13:

$$CI_i = \sum_{j=1}^{N} \frac{C_j^i Q_j}{Q_i} \quad \text{Equation 13}$$

Unlike the cold-aisle capture index, the hot aisle capture index calculation depends on the rack (and cooler) airflow rates. The difference arises because while both variants of CI are defined with respect to rack airflow rates, the computed values of interest in cold-aisle analyses are rack-inlet concentrations while those in hot-aisle analyses are cooler-inlet concentrations.

In accordance with some embodiments, CI values may be determined as discussed in the '592 patent. According to one or more embodiments, CI values may be determined as discussed in the '217 patent, which uses Equation 14 below:

$$CI_i = \sum_{j=1}^{N} f_{ij} \quad \text{Equation 14}$$

The '217 patent discloses a process for determining CI values using Equation 14. Further, as part of a hot-aisle calculation, hot-aisle CIs (HACIs) are computed from their constituent $f_{ij}$s which are defined as the fraction of airflow from rack i which is captured by cooling source j and is expressed below as Equation 15:

$$HACI_i = \sum_{j=1}^{N} f_{ij} \quad \text{Equation 15}$$

where N is the number of local cooling sources.

In a similar manner, in cold-aisle-CI calculations, cold-aisle CIs (CACIs) can be computed from their constituent $g_{ij}$s which are defined as the fraction of airflow of rack i which originated from cooling source j and is expressed below as Equation 16:

$$CACI_i = \sum_{j=1}^{N} g_{ij} \quad \text{Equation 16}$$

Figure 11:
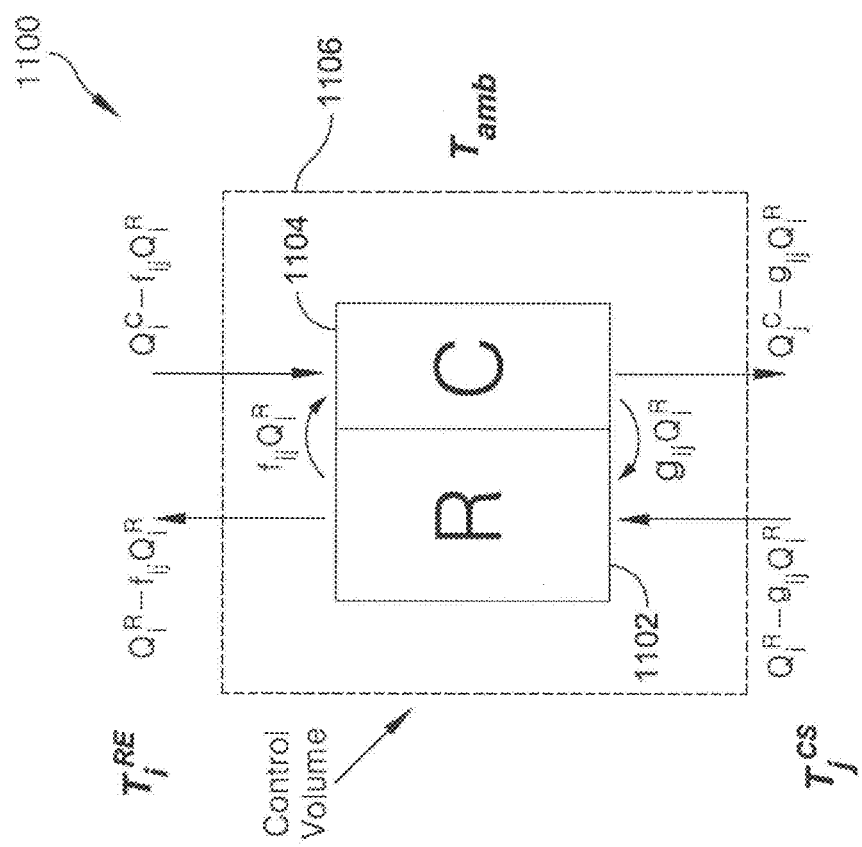
FIG. 11 is an example of a data center that can be analyzed in accordance with one or more aspects of the disclosure.

Thus, $f_{ij}$ and $g_{ij}$ may be the fundamental building blocks of HACI and CACI respectively, and they may completely characterize the multiple airflow streams which combine to make-up a rack's inlet and exhaust airflow patterns. The method described in the '217 patent uses the $f_{ij}$s and the $g_{ij}$s to determine relevant temperatures in a data center. For instance, FIG. 11 shows a small data center 1100 populated with one rack 1102 and one cooler 1104 that may be used to describe the method. The room is considered to be perfectly sealed such that there is no heat transfer to the external surroundings. The dashed line 1106 represents a control volume around the equipment; rack-cooler airflow interactions take place within the control volume while airflow interactions with the surrounding data center environment occur across the control volume boundaries.

Balancing the energy flow across the control volume boundaries and generalizing to any n racks and N cooling sources leads to Equation 17:

$$\sum_{i=1}^{n}\left(1 - \sum_{j=1}^{n} f_{ij}\right) Q_i^R T_i^{RE} + \sum_{j=1}^{N}\left(Q_j^C - \sum_{i=1}^{n} g_{ij} Q_i^R\right) T_j^{CS} = \quad \text{Equation 17}$$

$$\sum_{j=1}^{N}\left(Q_j^C - \sum_{i=1}^{n} f_{ij}Q_i^R\right)T_{amb} + \sum_{i=1}^{n}\left(1 - \sum_{j=1}^{N} g_{ij}\right)Q_i^R T_{amb}$$

where $Q_i^R$ and $Q_j^C$ are the airflow rates of rack i and cooler j respectively. $T_i^{RE}$, $T_j^{CS}$, and $T_{amb}$ are the exhaust temperature of rack i, the supply temperature of cooler j, and the ambient data center room temperature.

The cooler supply temperature is a function of cooler capacity and its control algorithm; however, it can be written generally as a function of cooler return temperature and cooler airflow rate as shown in Equation 18:

$$T_j^{CS} = T_j^{CS}(T_j^{CR}, Q_j^C) \quad \text{Equation 18:}$$

Cooler return temperature is the result of the mixing of streams which originate at rack exhausts or from the ambient as shown in Equation 19:

$$T_j^{CR} = \frac{\sum_{i=1}^{n} f_{ij}Q_i^R T_i^{RE}}{Q_j^C} + \left(1 - \frac{\sum_{i=1}^{n} f_{ij}Q_i^R}{Q_j^C}\right)T_{amb} \quad \text{Equation 19}$$

Rack inlet and exhaust temperatures are related by an assumed temperature rise $\Delta T_i^R$ across the rack as shown in Equation 20:

$$T_i^{RE} = T_i^{RI} + \Delta T_i^R \quad \text{Equation 20:}$$

Rack inlet temperature is the result of the mixing of streams which originate at each cooler supply or from the ambient as shown in Equation 21:

$$T_i^{RI} = \sum_{i=1}^{N} g_{ij}T_j^{CS} + \left(1 - \sum_{j=1}^{N} g_{ij}\right)T_{amb} \quad \text{Equation 21}$$

Equations 17-21 form a coupled set of 2N+2n+1 equations for 2N+2n+1 unknowns which, when solved, provide the inlet and exhaust temperatures of all racks, the return and supply temperatures of all coolers, and the ambient temperature.

Figure 12:
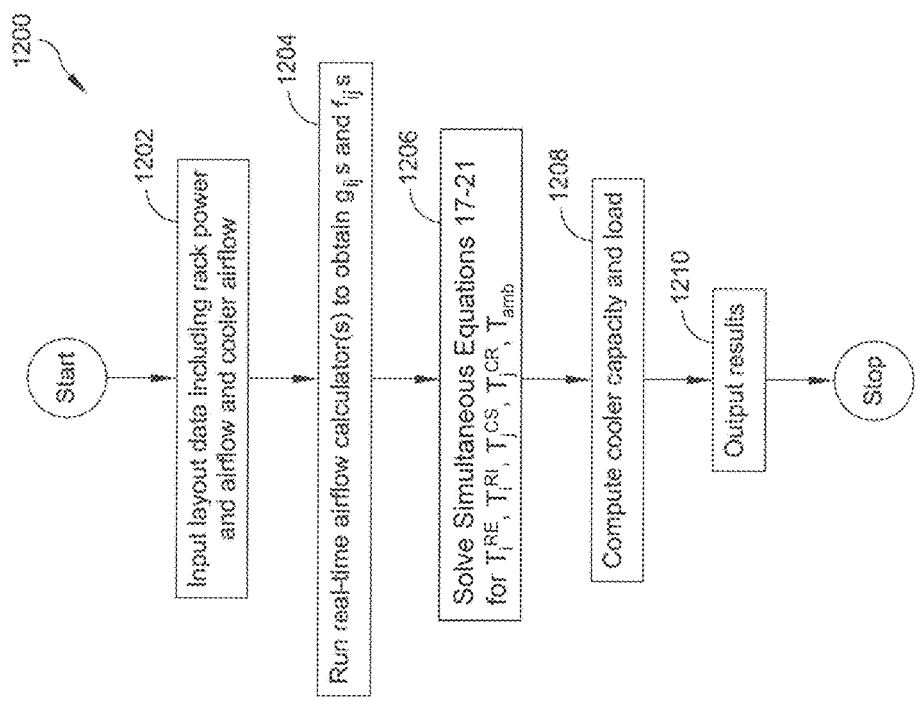
FIG. 12 is a flowchart of a process in accordance with one or more aspects of the disclosure.

The general process 1200 for predicting data center airflows and temperatures according to the '217 patent is shown in FIG. 12. First at act 1202, input data is entered either automatically or manually into the data center design or management software. Next at act 1204, airflow patterns associated with racks and coolers are determined using any of a number of real-time tools discussed above and in documents referenced above. Multiple algorithms may be called for a complete data center analysis (e.g. different algorithms for hot and cold aisle two-row clusters, single-row clusters, containment clusters, etc.) Next at act 1206, Equations 17-21 are solved for all unknown rack, cooler, and ambient temperatures. If desired, at act 1208, the maximum cooler capacity and load at the predicted conditions may be computed for each cooler. At act 1210 the computed temperatures (and cooler capacities if calculated) are output, for example, for use in the optimization process of the subject disclosure. As explained in the '217 patent, Equations 17-21 are linear except Equation 18 which depends on the cooler characteristics. In most practical cases, Equation 18 is piecewise linear in that, below some threshold return temperature, the cooler is able to supply air at a fixed set point-temperature. Above the threshold, the supply temperature tends to rise linearly with return temperature. This prevents a direct simultaneous solution to Equations 17-21 with a linear solver; however, for at least some embodiments, it is sufficient to assume that the cooler supply temperature is equal to the known supply temperature and then simply check to see if the capacity has been exceeded based on the resulting temperatures. If the capacity has been exceeded a warning may be presented to the user and changes may be made to the layout until there are no more cooling warnings. The '217 patent also discusses alternate processes for handling the non-linear cooler Equation 18.

According to some embodiments, the data center may be modeled as one cooler and one IT rack. For instance, according to some embodiments, a lumped temperature model used by the disclosed optimization process may assume that all racks in the room (e.g., data center) may be combined into one, unified rack object having the cumulative properties of all the racks. Similarly, all cooling supplies in the room, such as local coolers, CRAHs, or tiles) may be combined into one cooling object. According to a further aspect, average temperatures for this system may be determined by selecting a hot aisle and a cold aisle capture index. For instance, hot aisle and cold aisle capture indices (or equivalently, the $f_{ij}$ and $g_{ij}$) may be determined either by user estimation, calibration, fit to sensor data, or may be determined by performing a CFD simulation of the system.

According to another embodiment that uses a lumped model for the data center, the single lumped cooler airflow and supply and return temperatures may be assumed to be equal to the actual cooler airflow and average supply and return temperatures respectively. Similarly, the single lumped rack airflow and inlet and exhaust temperatures may be assumed to be equal to the actual total rack airflow and average inlet and exhaust temperatures respectively. Inputs to the model may include information about the predominant cooling architecture of the data center, measured temperatures, and parameters associated with the facility's chillers, coolers, and IT equipment racks, as well as a maximum inlet temperature.

Optimization Solver

The optimization process 100 shown in FIG. 1 also includes an optimization solver 115, which employs the use of one or more nonlinear optimization methods, such as derivative-based deterministic algorithms, derivative-free deterministic algorithms, and stochastic techniques such as heuristic/genetic, random search, or simulated annealing algorithms. For example, a nonlinear optimization solver is described in "An Interior Point Algorithm for Large-Scale Nonlinear Optimization with Applications in Process Engineering" (A. Wächter, PhD Thesis: Carnegie Mellon University, 2002), the entire disclosure of which is incorporated herein by reference. While deterministic algorithms always find the same optimal set point, stochastic methods are suitable for solving many complex problems but at the disadvantage of requiring many simulations. According to at least one embodiment, the optimization solver 115 uses a deterministic algorithm, such as the interior-point method presented by Wächter. This approach is designed to find (local) solutions of mathematical optimization problems of the form:

$$\min f(x)$$

$$x \in \mathbb{R}^n$$

such that:

$$g\_L \leq g(x) \leq g\_U$$

$$x\_L \leq x \leq x\_U$$

where: $f(x)$: $\mathbb{R}^n \to \mathbb{R}$ is the objective function, and $g(x)$: $\mathbb{R}^n \to \mathbb{R}^m$ are the constraint functions. The vectors g_L and g_U denote the lower and upper bounds on the constraints, and the vectors x_L and x_U are the bounds on the variables x. The functions $f(x)$ and $g(x)$ can be nonlinear and nonconvex, but should be twice continuously differentiable. This general form is discussed further below.

Optimization Process

The optimization process 100 shown in FIG. 1 uses two kinds of data points, including real-time input data that may be used by the airflow and temperature simulation module 105 to generate estimated values, and the energy model 110 to determine energy consumption. Additional types of data points may also be used to calibrate the simulation or otherwise match the simulation to reality, i.e., a real life running data center.

In accordance with various embodiments, the optimization process 100 shown in FIG. 1 operates under the conditions that power consumption of the cooling units, including the CRAHs and the chillers, is minimized while the supply airflow of each CRAH unit, the supply chilled water temperature, and the inlet temperature of each rack are maintained within certain operating ranges. These conditions may be expressed as shown below collectively as Equation 22:

Equation 22: Minimize power consumption as a function of $(Q^S, T^S, X)$, such that $\underline{Q_j^S} \leq Q_j^S \leq \overline{Q_j^S}$ for all CRAH units $\underline{T_j^S} \leq T_j^S \leq \overline{T_j^S}$ for all chillers $\max(T_i^r) \leq \overline{T_i^r}$ for all racks $\min(T_i^r) \leq \underline{T_i^r}$ for all racks $X_j \in \{0,1\}$ for all cooling units where:
$Q_j^S$ is the airflow rate of cooling source j,
$T_j^S$ is the supply temperature of cooling source j,
$T_i^r$ is the inlet temperature of rack i,
$\underline{T}, \overline{T}$ are the lower and upper bounds of temperature, respectively,
$\underline{Q}, \overline{Q}$ are the lower and upper bounds of airflow rates, respectively, and
X is an indicator of whether a CRAH is ON/OFF.

The fidelity of the simulation and the time needed to perform the optimization may be increased by employing one or more improvements, three of which are discussed in further detail below. According to various aspects, the improvements address one or more issues that are common to simulation-based optimization and control techniques, such as variability in the results of simulations, difficulty in utilizing simulation and sensor data in controls (difficulty in calibration), and computationally expensive simulations. One or more of these improvements can make simulation-based optimization practical in a data center environment.

Improvement 1—Variance Reduction

The noise and variance of numerical simulations can slow or hinder use of many types of deterministic optimization algorithms. Noise and variance may be reduced by improving the precision of the simulation, but this may require large computational times. Noise and variance may also be reduced by taking larger perturbations in the derivatives, but the resulting loss of accuracy may also send the optimization routine in the wrong direction by seeking an inaccurate solution. Further, if larger perturbations are taken, then the tolerances that control the termination of the algorithm have to be relaxed, which may cause early termination and may lead to an inaccurate optimal solution.

In accordance with one or more embodiments, a variance reduction technique may be used to decrease the noise and/or variance of the numerical simulation. This technique minimizes the power consumption of the cooling unit while maintaining CRAH airflows and supply chilled water temperatures within a desired operating range. At the same time, the average of the N highest cell's inlet temperature is maintained below a threshold limit, and the average of the N lowest cell's inlet temperature is maintained above a threshold limit. These conditions are expressed collectively as Equation 23 shown below:

Equation 23: Minimize power consumption as a function of $(Q^S, T^S, X)$, such that $\underline{Q_j^S} \leq Q_j^S \leq \overline{Q_j^S}$ for all CRAH units $\underline{T_j^S} \leq T_j^S \leq \overline{T_j^S}$ for all chillers $\underline{T} \leq \text{Min}(\text{average}(T_i^r))$ for all racks i $\text{Max}(\text{average}(T_i^r)) \leq \overline{T}$ for all racks i $X_j \in \{0,1\}$ for all cooling units where:
Min(average($T_i^r$)) is the average of the N lowest cells' inlet temperature for rack i,
Max(average($T_i^r$)) is the average of the N highest cells' inlet temperature for rack i,
$\underline{T}, \overline{T}$ are the lower and upper bounds of temperature, respectively, and
X is an indicator of whether a CRAH is ON/OFF.

Instead of performing the optimization based on the highest single cell inlet temperature, this technique optimizes by using the average of the N highest cells' inlet temperature. Noise is reduced since each value is generally unbiased, and using the average of a few values for each rack reduces the effects of any variations. This approach may also be applied to different applications besides data centers, such as general buildings, as long as similar types of simulations are used.

Figure 2:
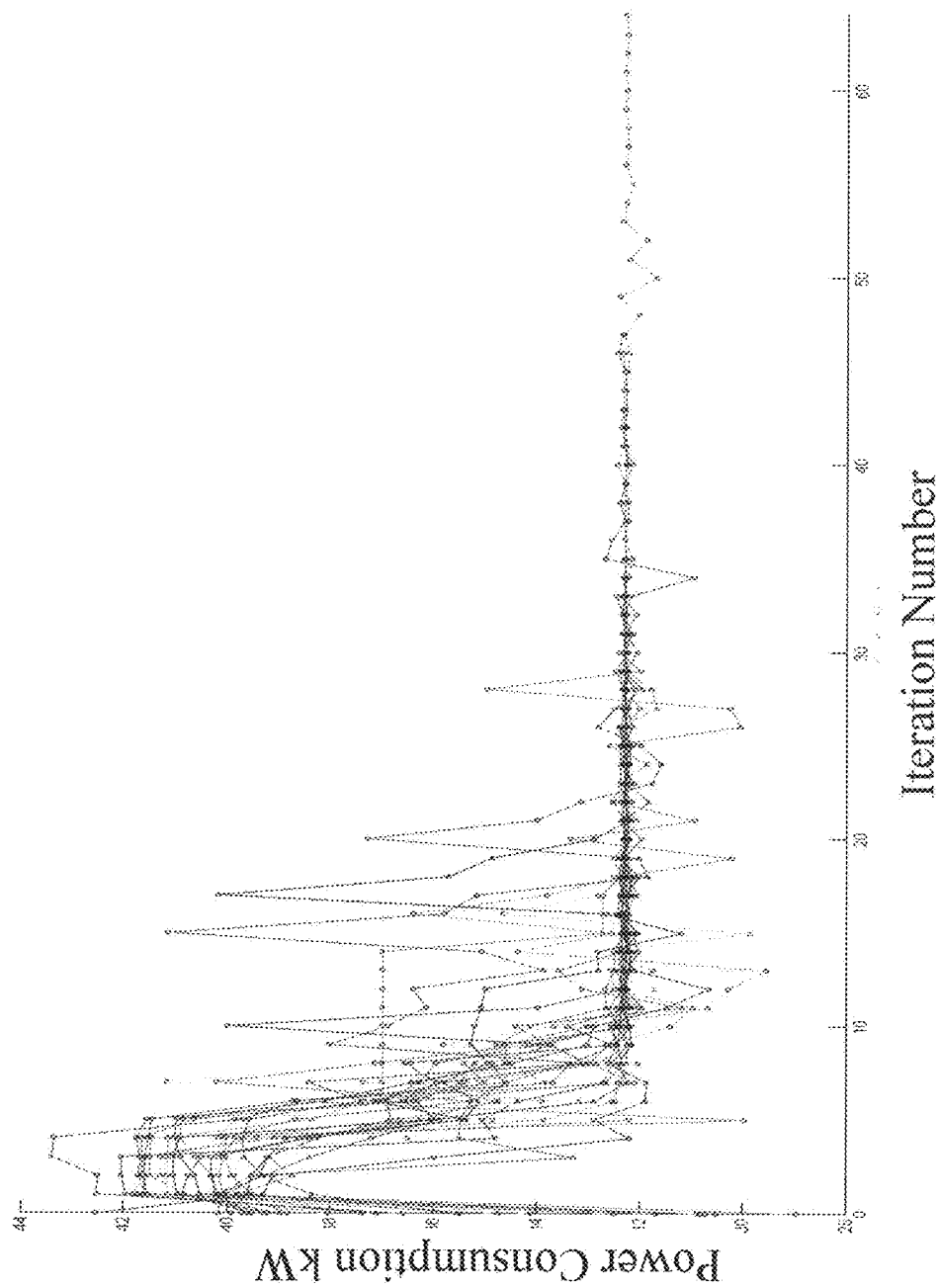
FIG. 2 shows results from a first simulation performed in accordance with one or more aspects of the disclosure.
Figure 3:
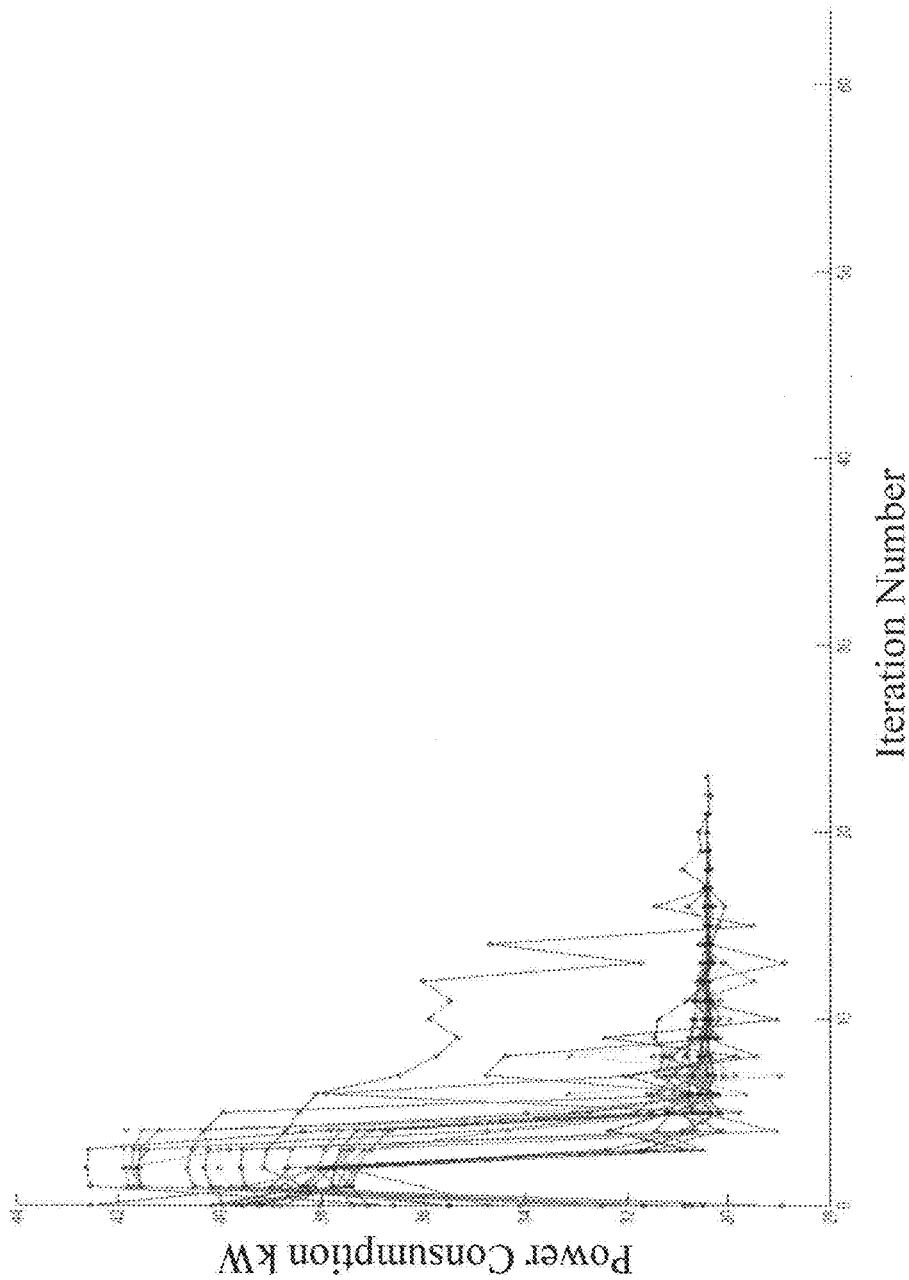
FIG. 3 shows results from a second simulation performed in accordance with one or more aspects of the disclosure.

The benefits of this approach are illustrated by comparing the results represented in FIG. 2 with that of FIG. 3. Both sets of results were created by performing 25 runs for a specific data center layout using a set of randomly chosen starting points. FIG. 2 illustrates an optimization based on the maximum of the highest single cell inlet temperature of each rack that is predicted by the simulation. As shown in FIG. 2, this optimization required, on average, about 29 (28.6) iterations to converge to solution. In contrast, FIG. 3 illustrates an optimization based on the average of the 12 highest cells' inlet temperature of each rack that is predicted by the simulation and uses the same random starting points used in the optimization represented in FIG. 2. As shown, FIG. 3 indicates that the required number of iterations is reduced by almost half, converging after about 16 (15.8) iterations.

Improvement 2—Calibration

In general, optimization results are only as good as the underlying simulation that is used to provide the temperature and airflow estimates. One common source of error in numerical simulations includes input error, such as input parameters corresponding to rack power or airflow values that don't match real operating conditions. Another source of error is related to modeling errors, where the simulation only approximately captures the tendencies of the objects. In addition, solver error and noise also introduce error, since the airflow simulation solution method is approximate and is subject to numerical error, discretization error, and other issues.

Figure 4:
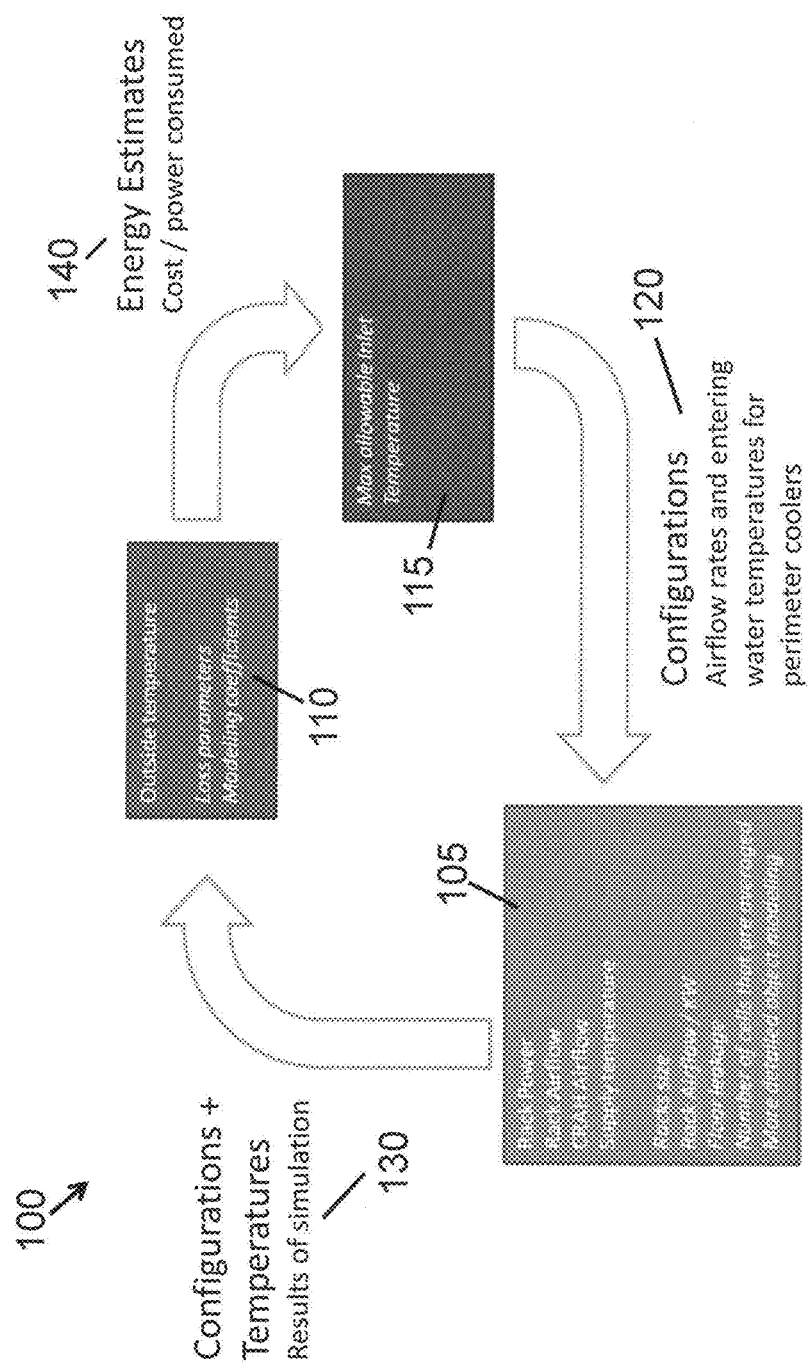
FIG. 4 is a flow diagram of another optimization method according to one or more aspects of the disclosure.

The calibration technique disclosed herein features a process for minimizing error through two types of calibrations. The first includes real-time updating of inputs such as rack power and airflow. The second includes statistical tuning of models and solvers. FIG. 4 illustrates a flow chart similar to that shown in FIG. 1, but includes non-limiting examples of parameters available for calibration associated with the airflow and temperature simulation module 105, the energy model 110, and the optimization solver 115. Referring to FIG. 4, parameters that may be used for statistical tuning are shown in italics, whereas non-italics-marked parameters are examples of real-time data points that may be updated at regular intervals. These calibration parameters are also represented below in Table 2.

TABLE 2

| Calibration Parameters | | |
|---|---|---|
| | Parameters for Statistical Tuning | Parameters for Real-Time Updates |
| Airflow and Temperature Simulation Module | Rack size Rack airflow/kW Floor leakage Number of cells that are averaged More detailed object modeling | Rack power Rack airflow CRAH airflow Chiller supply temperature |
| Energy Model | Loss parameters Modeling coefficients | Outside temperature |
| Optimization Engine | Maximum allowable inlet temperature | |

Real-time updating may be made possible by implementation of one or more data center design and management packages, such as StruxureWare™ for Data Centers software, available from Schneider Electric. Statistical tuning sensor data may be implemented by using any one of a number of different numerical models, including regression, Kriging, neural networks, and Bayesian data analysis.

Improvement 3—Metamodels

Figure 5:
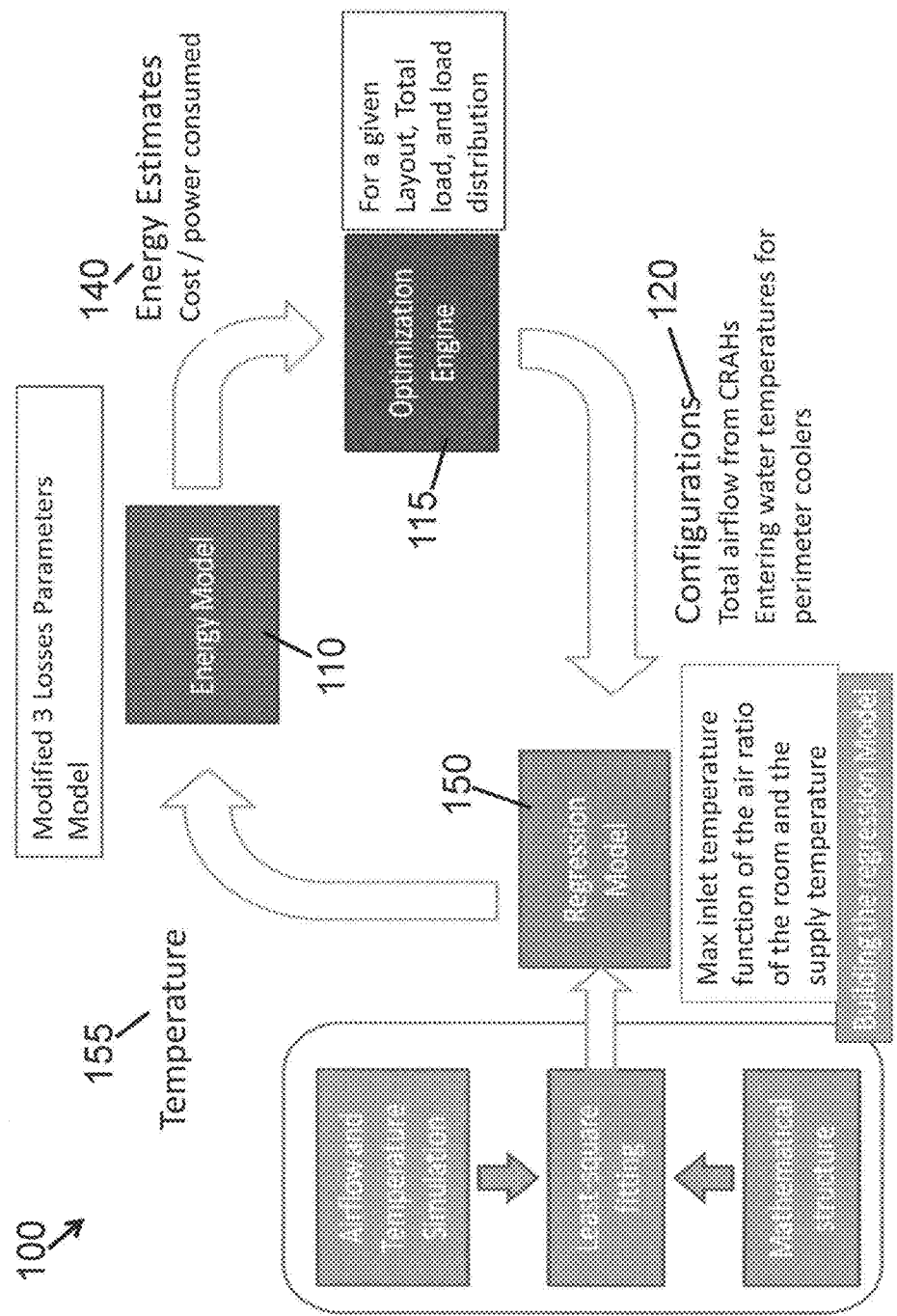
FIG. 5 is a flow diagram of yet another optimization method according to one or more aspects of the disclosure.

The third method for improving the optimization process is featured in FIG. 5 and includes utilizing a specific metamodeling approach that is capable of quickly providing approximate control by building a regression model of the system based on a small number of simulations and then solving a simplified optimization problem. A metamodel may be used as an alternative to the possible large number of simulation runs that certain optimization routines may require.

A metamodel, otherwise referred to herein as a surrogate model, may share many important characteristics of the original system. The metamodel approach offers several advantages, including fast computational times, derivatives that are relatively simple to compute, and little or no numerical noise. Metamodels may also be built from a combination of simulation and sensor data. Although metamodels have not typically been used within the context of a data center temperature control, the metamodel disclosed herein may be used to predict the maximum rack inlet temperature within a data center.

As shown in FIG. 5, this approach simplifies the process by replacing the airflow and temperature simulation module 105 with a regression model 150. Instead of considering each individual CRAH unit's airflow, each individual rack's power and maximum inlet temperature, the individual values are grouped together to provide a "lumped" formulation that includes a total airflow coming out of the CRAH, a total load of all the racks, and a maximum rack inlet temperature. The lumped formulation predicts the maximum rack inlet temperature 155 based on the total load of the racks and the total CRAH airflow. In situations where the resulting maximum rack inlet temperature 155 may be inaccurate, a different lumped formulation and a regression method may be used to provide a more accurate maximum rack inlet temperature. According to various aspects, the regression model may require several initial simulations, but once built, further simulations are not required. The lumped formulation for the maximum rack inlet temperature 155 may be expressed below as Equation 24:

$$T_{rin} = T^S + \Delta T_{rack} * \frac{Airflow_{load}}{Airflow_{cooling}} * (1 - CI) \quad \text{Equation 24}$$

where:

$T_{rin}$ is the maximum rack inlet temperature predicted by the lumped model,

CI is the capture index that can be used as a parameter, but in certain instances this one parameter may not be sufficient for capturing a real life maximum temperature trend, $T^S$ is the supply temperature of the cooling airflow;

$Airflow_{load}$ is the sum of the individual airflow that comes out of the racks, and $Airflow_{cooling}$ is the sum of the individual airflow that comes out of the CRAHs.

In certain instances, the lumped formulation shown above may be insufficient for capturing all of the possible trends for the maximum inlet temperature for a data center. For example, the number of parameters may not be large enough to produce results that match reality and/or simulation predictions. Therefore, a mathematical structure inspired from the lumped model may be used that includes an increased number of parameters. In accordance with various aspects, the additional linear coefficients may allow a user to perform a higher-order least-squares regression which may result in a better fit to the simulated data. This mathematical structure performs a least squares fit and may be expressed as Equation 25:

$$T_{rin} = T^S + \sum_{j=0}^{N} c_j * \Delta T_{rack} * \frac{1}{AR^j} \quad \text{Equation 25}$$

Where AR, the air ratio is defined as:

$$AR = \frac{Airflow_{cooling}}{Airflow_{load}}$$

and $c_j$ is a fitted parameter (coefficient) and is discussed in further detail below.

With enough data and for N values that are sufficiently large, the model shown above is capable of fitting to reality and/or simulation predictions for one or more data center layouts. In certain instances, an N value of 4 is sufficiently large enough to produce improved results. The choice of N and the number of points to be fitted may be important in determining the usability and improving the accuracy of the optimization.

The metamodel approach discussed above provides several advantages. For example, speed is enhanced, since the number of simulations needed to build the regression model may range from only 5 to 20. Also, there is little or no noise associated with the optimization, which leads to overall better performance. Further, in accordance with one or more aspects, no more than a 2% difference exists between the results for energy consumption and/or savings produced from the regression/metamodel approach when compared to results obtained from a full simulation optimization. According to various aspects, the metamodel approach also provides a model that may be tuned through simulation results and/or sensor data.

According to various aspects, the regression model discussed above may also be used as a starting point for a full simulation optimization. Providing a good starting point reduces the risk that the optimization results are inaccurate, and may also decrease the amount of time and number of iterations for performing the optimization.

EXAMPLES

The systems and methods described herein will be further illustrated through the following examples, which are illustrative in nature and are not intended to limit the scope of the disclosure.

Example 1—Data Center Layout A

Figure 6:
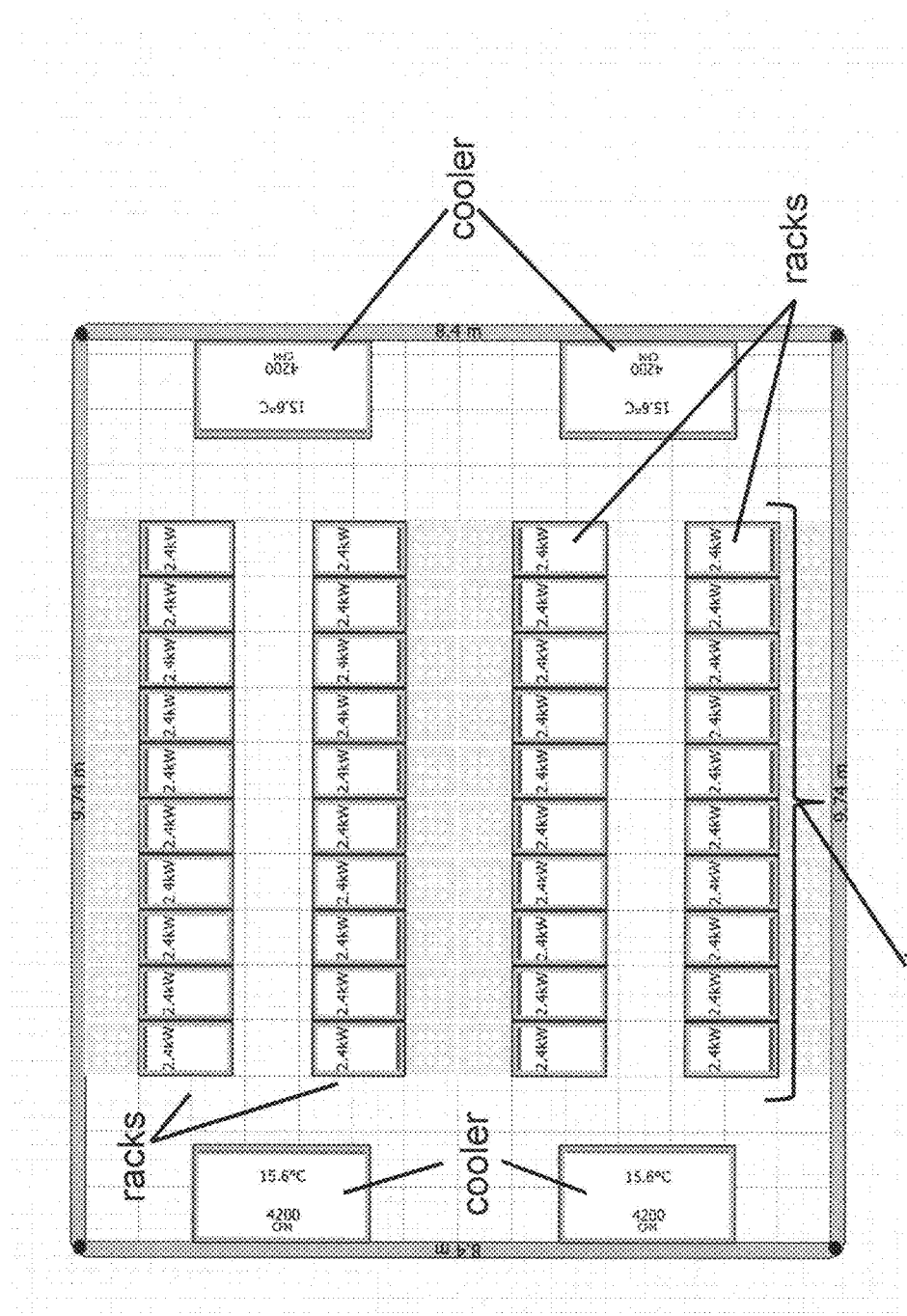
FIG. 6 shows a top view of a first example of a data center according to one or more aspects of the disclosure.

A first example is provided of a simulation-based method, as discussed above, for determining energy efficient control parameters for cooling equipment. A MATLAB® implementation was used to model the data center shown in FIG. 6, and several optimization strategies were compared against a conventional control strategy. As shown, the date center layout shown in FIG. 6 features 40 individual 2.4 kW capacity racks that are cooled by four CRAHs, where each CRAH has a CFM rating of 4200 and a $T_{max}$ of 15.6° C. (~60° F.).

Figure 7:
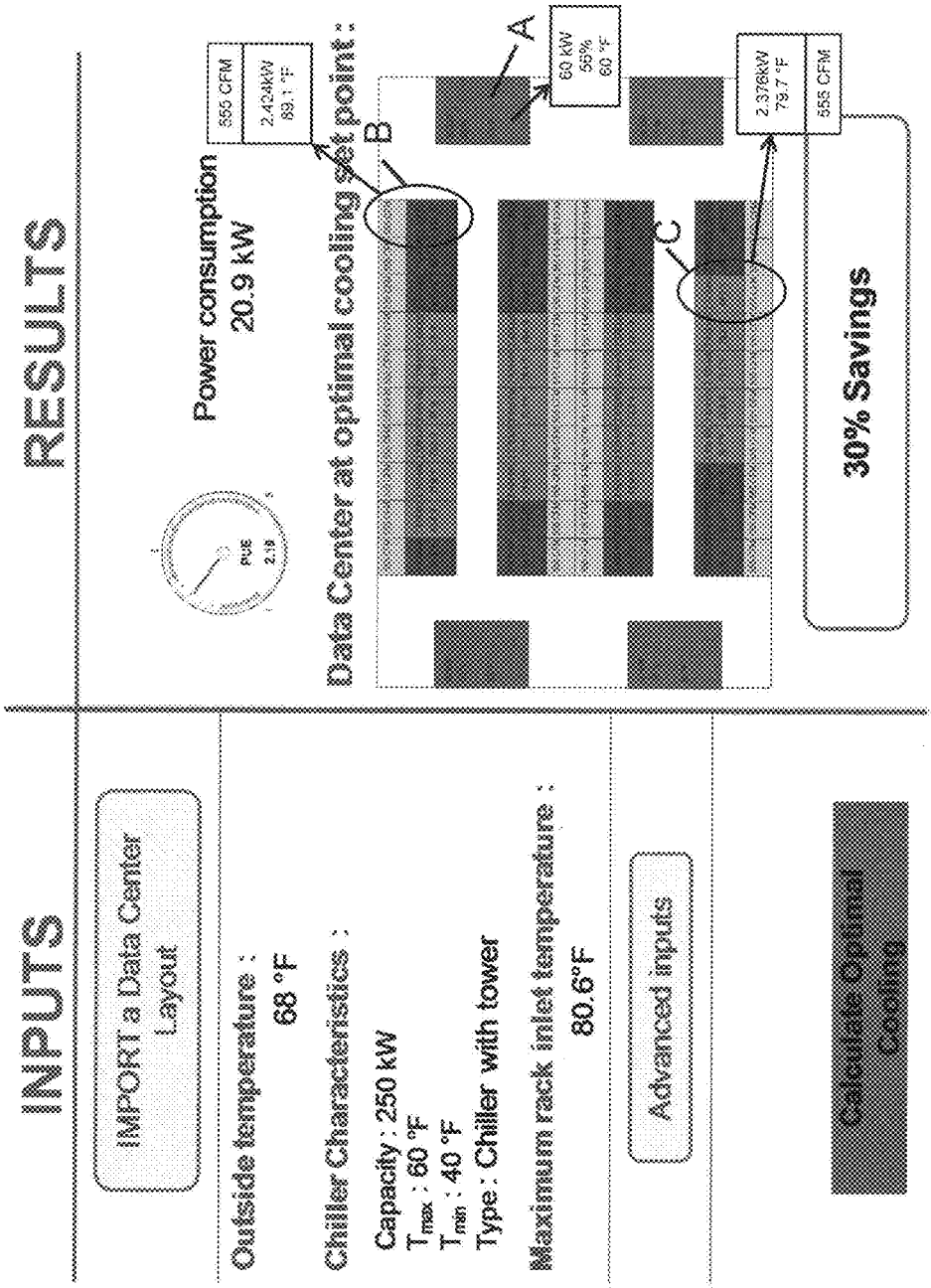
FIG. 7 shows a user interface provided by an optimization method in accordance with one or more aspects of the disclosure.

FIG. 7 presents a sample graphical user interface that may be used for a system that implements the simulation-based optimization method, and includes a dashboard featuring inputs, optimization routines, and results. For example, the user interface featured in FIG. 7 may be used in a software tool of one embodiment to provide data input blocks for the user to input data to the tool in addition to presenting results to the user. However, it will be appreciated that according to some embodiments, a controller may automatically obtain input data. According to this example, a user provides estimates of certain required parameters for the energy model calculation of the CRAH, PDU, and UPS of a particular data center configuration. For instance, on the left side of FIG. 7, a specific data center layout may be imported, and in instances where this includes a model of a chiller, input data may include the outside temperature and one or more of the chiller's characteristics, such as capacity, $L_{max}$ and $L_{min}$, as well as the maximum rack inlet temperature. Once these input parameters are provided, the method uses one or more optimization strategies, as explained further below, to find the optimal set points for the airflow of each CRAH and for the airflow temperature provided by the chiller to each rack, as shown on the right side of FIG. 7. For example, the CRAH labeled "A" on the right side of FIG. 7 is running the airflow at 56% of its maximum. In addition, the circled rack indicated at "B" has an inlet temperature of 89.1° F., which is over the maximum temperature of 80.6° F. (see left side of FIG. 7), and therefore may be represented in a different color than the circled rack indicated at "C" that has an inlet temperature of 79.7° F. (which is under the maximum temperature). One or more of these optimized results may be used to adjust, for example, an airflow setting of the cooling unit, and/or a temperature of a coolant supplied to the cooling unit. According to this example, these values were determined using the open source software IPOPT (Interior Point Optimization). The right side of FIG. 7 may also indicate the power consumption, cost/energy savings, and PUE of the selected optimization strategy.

For this example, three different control strategies based on simulation-based optimization were investigated and compared against a conventional control strategy for three different load settings (low, medium, and high). For the data center modeled in FIG. 6, low load corresponds to 2.4 kW/rack, medium load corresponds to 3.2 kW, and high load corresponds to 4.8 kW. The relative ratios of low:medium:high is therefore (1):(4/3):(2). The conventional control included running each CRAH at a fixed airflow that was 95% of the maximum airflow value. The supply temperature for the CRAH was calculated based on a PFM (Potential Flow Model) simulation, and was set at a fixed value of 5° C. below the maximum rack inlet temperature. The corresponding PUE and power consumption values were then calculated.

The first simulation-based optimization method (denoted as "Full") included a full optimization that took into account each individual CRAH. The second simulation-based optimization method (denoted as "Approximate") used a simpler approach, which included optimizing the energy consumption by taking into account the total airflow rate (as discussed above in reference to the metamodel/regression-based improvement) and used a regression model built from five airflow/thermal simulations. A PFM method was used as the solver for this particular strategy. The third simulation-based optimization method (denoted as "Combined") took the temperatures generated from the Approximate method and used them as a starting point for a full optimization, which in most instances reduced the number of iterations and decreased the amount of time required to converge to a solution. The results shown below in Tables 3-6 for the Combined method reflect both the amount of time needed to build the regression model and the actual time spent in the optimization process itself. For instance, the time represented in Table 4 takes into account the time needed to build the regression models, run airflow simulations, and the time spent in the optimization process. PUE is the data center efficiency and is expressed as the ratio between the total facility power to the IT equipment power. If the data center were 100% efficient (PUE of 1), all power supplied to the data center would reach the IT loads.

TABLE 3

Optimal Power Consumption from Three Different Optimization Methods
DATA CENTER APP

| Datacenter Layout | Full | Combined | Approximate | Conventional Control |
|---|---|---|---|---|
| | Power Consumption in KW | | | |
| LayoutAHighLoad | 30.426 | 30.422 | 30.386 | 37.787 |
| LayoutALowLoad | 17.962 | 17.962 | 17.962 | 27.174 |
| LayoutAMediumLoad | 20.736 | 20.737 | 20.667 | 29.742 |

TABLE 3-continued

Optimal Power Consumption from Three Different Optimization Methods
DATA CENTER APP

| Datacenter Layout | Full | Combined | Approximate | Conventional Control |
|---|---|---|---|---|
| | | PUE | | |
| LayoutAHighLoad | 1.2113 | 1.2113 | 1.211 | 1.2624 |
| LayoutALowLoad | 1.2495 | 1.2495 | 1.2495 | 1.3774 |
| LayoutAMediumLoad | 1.2187 | 1.2187 | 1.218 | 1.3137 |

TABLE 4

Time and Percentage Deviation from Optimal
Power Required for Each Strategy
DATA CENTER APP

| | Time in minutes | | |
|---|---|---|---|
| Datacenter Layout | Full | Combined | Approximate |
| LayoutAHighLoad | 6.91 | 2.79 | 0.23 |
| LayoutALowLoad | 3.39 | 1.24 | 0.20 |
| LayoutAMediumLoad | 6.68 | 2.83 | 0.21 |

| | Percentage difference from best solution found | | | |
|---|---|---|---|---|
| | Full | Combined | Approximate | Conventional Control |
| LayoutAHighLoad | 0.05 | 0.04 | 0.08 | 24.26 |
| LayoutALowLoad | 0.00 | 0.00 | 0.00 | 51.28 |
| LayoutAMediumLoad | 0.02 | 0.02 | 0.31 | 43.46 |

TABLE 5

Power Consumption Savings
DATA CENTER APP

| | Saving on power consumption % | | |
|---|---|---|---|
| Datacenter Layout | Full | Combined | Approximate |
| LayoutAHighLoad | 19.480 | 19.493 | 19.588 |
| LayoutALowLoad | 33.898 | 33.898 | 33.898 |
| LayoutAMediumLoad | 30.282 | 30.279 | 30.513 |

TABLE 6

Percentage Difference in Efficiency over Strategy 1
DATA CENTER APP

| Datacenter Layout | Decrease in the number of iterations % Combined |
|---|---|
| LayoutAHighLoad | 66.7 |
| LayoutALowLoad | 87.5 |
| LayoutAMediumLoad | 66.7 |

| Datacenter Layout | Combined | Approximate |
|---|---|---|
| | Decrease in the number of simulation calls % | |
| LayoutAHighLoad | 59.9 | 97.8 |
| LayoutALowLoad | 68.3 | 95.8 |
| LayoutAMediumLoad | 60.2 | 97.8 |
| | Decrease in time % | |
| LayoutAHighLoad | 59.69 | 96.70 |
| LayoutALowLoad | 63.29 | 94.07 |
| LayoutAMediumLoad | 57.62 | 96.91 |

The "best solution" was found using a random search process prior to the optimization, and is featured as a benchmark in Table 4.

Table 3 shows the advantage of the three strategies compared to the conventional control strategy in terms of energy consumption. For example, 30.43 kW of power was required for the Full and Combined methods, whereas 37.79 kW of power was required by the conventional control strategy, which indicates a 19% reduction in total power consumption. In Table 4, the performance of all methods was compared by calculating the percentage difference of their solutions from the best solution. As indicated, the Approximate and Combined methods offer a time advantage over the Full optimization.

Table 3 indicates that the Approximate method gives the best results in terms of energy consumption, but the accuracy of these results is directly linked to the accuracy of the strategy's regression model, which utilized only five simulation points. The accuracy of this particular method may be improved, for example, by increasing the number of simulation points. The main advantage provided by the Approximate method is that a solution may be quickly found, as indicated in Table 4. According to this example, the Approximate method is much faster than the other two methods (0.2 minutes compared to 2-6 minutes), and the solution found is at the worst case 0.08% from the best solution in terms of energy consumption results. This implies that optimizing the total airflow rate instead of the airflow rates of each individual CRAH unit, and then distributing the total airflow rate among all the CRAHs may offer a good control strategy.

The results shown in Table 4 also indicates that using the results from the Approximate method as a starting point for the Full optimization, i.e., the Combined method, greatly improves the speed of performance without compromising the accuracy of Strategy 1 on its own, with the worst case giving a value of only 0.05% from the best solution.

Table 5 compares the savings of the three methods to the conventional control strategy in terms of power consumption, where all three methods offer comparable savings on power consumption. Although Table 5 indicates that the Approximate method leads to power consumption savings that are very close to the other two methods, these savings may appear to be slightly better since the accuracy of the metamodel is based on only five simulation points. As noted above, using a relatively small number of simulation points increases the speed of the Approximate method, but may also decrease the accuracy of the regression model.

Table 6 shows the advantages of the Approximate method and the Combined method over the Full optimization method in terms of speed, number of iterations, and the number of simulations that were performed, with the results indicating that the simulation runs using Approximate and Combined when compared to the Full optimization show a 60% improvement (for Combined) and a 95% improvement (for Approximate). As expected based on the results from Table 4, the first column in Table 6 indicates that the Combined method is faster than a Full optimization, since the starting values for the Combined method are the results generated by the Approximate method, and are hence already close to the optimal solution. As a consequence, the number of iterations required in the optimization routine is significantly reduced.

Example 2—Data Center Layout B

Figure 8:
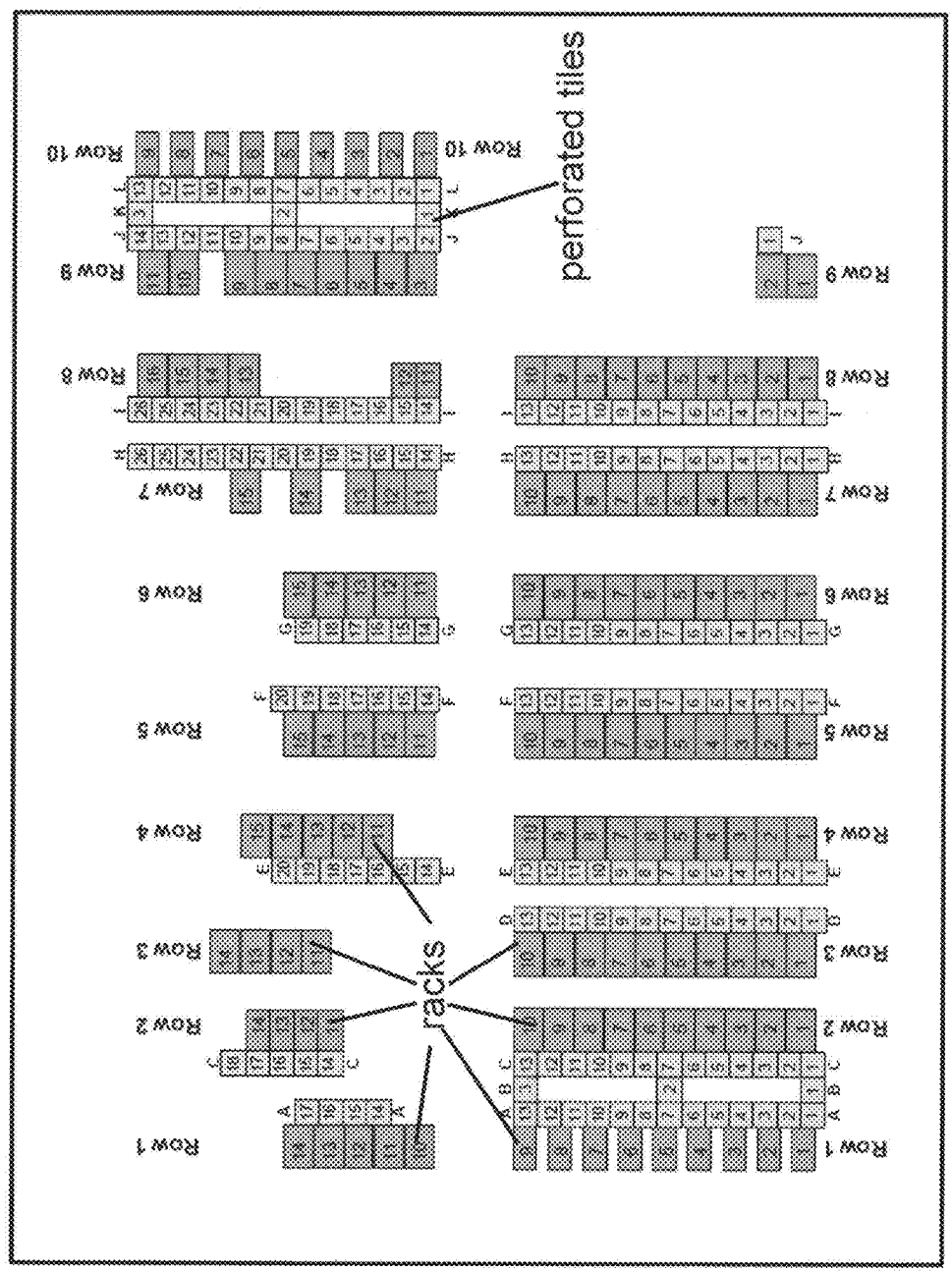
FIG. 8 shows a top view of a second example of a data center according to one or more aspects of the disclosure.

A second example is provided of a simulation-based method for determining energy efficient control parameters for cooling equipment according to the data center layout shown in FIG. 8, which includes 138 IT racks and 12 floor mounted power distribution units (PDUs) (located on boundaries of room and not explicitly shown in FIG. 8) and covers a space of 7400 square feet. Each cold aisle is supplied with cool air from 192 perforated tiles that are bolted and gasketed into the raised floor, which is free from any cutouts or leaks. Each hot aisle is positioned beneath a row of 83% open-area perforated ceiling tiles connected to a ceiling plenum. The data center IT equipment consumes approximately 316 kW and is supplied with approximately 102,000 cfm from a single central air handler (supplied by cool outside air).

A CFD simulation of the data center shown in FIG. 8, and as discussed further below, was performed using FloVENT® 10.1 software (supplied by Mentor Graphics), which used a simple "black box" model to represent the racks in the data center. The PDUs were modeled as cuboid structures that dissipated approximately 1 kW of heat via free surface convection, and the perforated floor tiles were modeled as fixed flow sources with equal flow rates. The ceiling tiles were modeled as resistance plates and a single fixed-flow air sink was used to model the louver through which air from the ceiling plenum returns to the air handler. The cells of the computational grid used to divide the space were sized to be at least 6 inches and at most 12 inches on any side.

According to this example, the optimization process is similar to the expression shown above in reference to Equation 22, and is represented below by Equation 26:

Equation 26: Minimize power consumption of the cooling system $P_{tot}$ such that $$\underline{Q_i^S} \leq Q_i^S \leq \overline{Q_i^S} \text{ for all cooling airflow sources}$$

$$\underline{T^S} \leq T^S \leq \overline{T^S}$$

$$\max_j T_j^{IT} \leq \overline{T^{IT}} \text{ for all IT equipment}$$

where:
$Q_i^S$ is the airflow rate of cooling source i,
$T^S$ is the supply temperature of the cooling airflow
$\underline{T},\overline{T}$ are the lower and upper bounds of the supply temperature, respectively,
$\underline{Q},\overline{Q}$ are the lower and upper bounds of the airflow rates of the cooling source i,
$\overline{T^{IT}}$ is the maximum allowable inlet temperature, and
$\max_j T_j^{IT}$ is the maximum predicted inlet temperature for all IT equipment, $P_{tot}$ is a nonlinear function of $Q_i^S$ and $T^S$, and $\max_j T_j^{IT}$ is implicitly a nonlinear function of $Q_i^S$ and $T^S$.

The data center shown in FIG. 8 uses external air to cool the data center in the fall and winter seasons, and therefore the energy consumption and subsequent cost can be modeled off of fan power alone. The configuration associated with FIG. 8 included 24 fans that each have a maximum flowrate $Q_0$ of 1000 cfm with a maximum power $P_0$ of 5.03 kW. Thus, the maximum flowrate of the system is 240,000 cfm. The power consumption of the cooling system $P_{tot}$ is computed as a function of total flowrate of the system Q, according to Equation 27 below:

$$P_{tot} = 24 * P_0 * \left(\frac{Q}{24 * Q_0}\right)^3 \quad \text{Equation 27}$$

According to Equation 27, the base performance delivers roughly 101,952 cfm and requires a total power of 9.262 kW. Power leakage associated with the phenomenon that servers and other components require more power at higher temperatures was not modeled in this example, but could be added to the energy model in accordance with other embodiments.

A metamodel was used to predict the maximum inlet temperatures to the racks, with the number of output parameters reduced by considering only the maximum inlet temperature for all racks in the room, instead of for each individual rack.

The regression model is expressed below by Equation 28 and is used to predict the maximum inlet temperature in the room as a function of the cooling air supply temperature, $T^S$ (which in this example was equal to 22° C.), the air ratio, AR, the average temperature rise across the racks $\Delta T_{rack}$, and a small set of constants, which in this instance are fitted parameters (otherwise referred to herein as "coefficients") $c_j$:

$$\max_j T_j^{IT} = T^S + \sum_{j=0}^{N} c_j * \frac{1}{AR^j} \quad \text{Equation 28}$$

where the air ratio is defined as shown above in reference to Equation 25.

Since the exact airflow rate of the IT servers was unknown, three metamodels based on three IT airflow rates were constructed: 200 cfm/kW, 125 cfm/kW, and 60 cfm/kW. For each IT airflow rate, a number of CFD simulations were run using the FloVENT® 10.1 software and are summarized below in Table 7:

TABLE 7

FloVENT ® simulation summary

| Airflow Rate | Number of simulations | Min total cooling airflow | Max total cooling airflow |
|---|---|---|---|
| 200 cfm/kW | 8 | 56,832 cfm | 96,488 cfm |
| 125 cfm/kW | 9 | 52,224 cfm | 101,952 cfm |
| 60 cfm/kW | 5 | 52,224 cfm | 101,952 cfm |

Using the metamodel approach discussed above, a value of N=3 was found to provide an adequate fit for the simulation data. Table 8 below shows the values found through least square regression for the set of coefficients:

TABLE 8

Metamodel Coefficients

| Constant | 200 cfm/kW | 125 cfm/kW | 60 cfm/kW |
|---|---|---|---|
| $c_0$ | 2.04 | 2.03 | 0.07 |
| $c_1$ | 0.30 | 0.51 | 7.28 |
| $c_2$ | 0.13 | 0.92 | 18.2 |
| $c_3$ | 2.21 | 8.22 | 9.66 |

Figure 9:
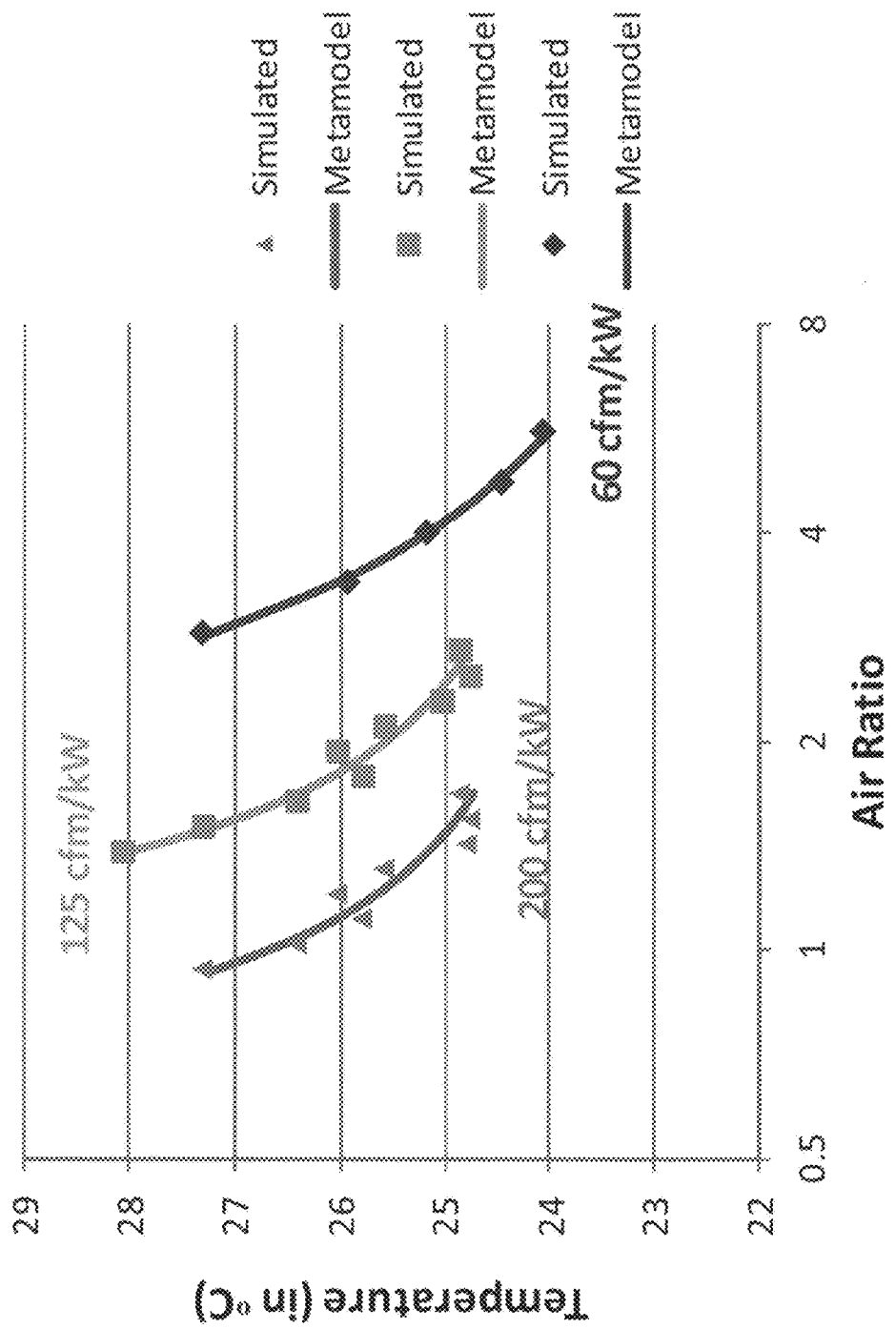
FIG. 9 is a graph of the results of a comparison study performed in accordance with one or more aspects of the disclosure.

The graph shown in FIG. 9 plots the comparison between the results using the metamodel against the results of the CFD simulation. Good agreement was found between the fit of the metamodel and the simulated data points, despite some noisy simulation results.

The optimization approach represented by Equation 26 was replaced with an energy model and a temperature metamodel. The energy consumption objective was replaced by Equation 27 and the airflow constraints were set at 0 and 240,000 cfm.

Each of the three IT airflow rate cases was optimized with a maximum inlet temperature constraint of 27° C. (i.e., $\overline{T^{IT}}=27$), which is in accordance with ASHRAE guidelines. The optimal airflow was computed with a simple numerical solver in MATLAB®, with the results shown below in Table 9:

TABLE 9

Optimization Results with Three IT Airflow Rates and Max T Inlet = 27° C.

|  | 200 cfm/kW | 125 cfm/kW | 60 cfm/kW |
|---|---|---|---|
| Q* (optimal airflow rate of all cooling sources) | 58,299 cfm | 58,433 cfm | 53,731 cfm |
| P*$_{tot}$ (optimal power consumption of the cooling system) % savings | 81.3% | 81.2% | 85.3% |

The results indicate that a system with the lowest IT airflow (60 cfm/kW) requires the least cooling airflow, which is not surprising, but this level of airflow also only requires 10% less optimal cooling airflow than a system with over three times the IT airflow (i.e., the highest airflow 200 cfm/kW). Further, the results from the highest airflow (200 cfm/kW) and second-highest airflow (125 cfm/kW) are almost equivalent.

Smaller gains were found when the optimization was re-run with a maximum inlet temperature constraint of 25° C. (i.e., $\overline{T^{IT}}=25$). The results are shown below in Table 10:

TABLE 10

Optimization Results with Three IT Airflow Rates and Max T Inlet = 25° C.

|  | 200 cfm/kW | 125 cfm/kW | 60 cfm/kW |
|---|---|---|---|
| Q* (optimal airflow rate of all cooling sources) | 89,604 cfm | 91,110 cfm | 75,838 cfm |
| P*$_{tot}$ (optimal power consumption of the cooling system) % savings | 32.2% | 28.7% | 58.8% |

These results indicate that the relative difference between the second-highest IT airflow (125 cfm/kW) and the lowest IT airflow (60 cfm/kW) increased dramatically, but the results from the highest airflow (200 cfm/kW) and second-highest airflow (125 cfm/kW) remain very similar. In this instance, the lowest IT airflow requires a little bit more than half of the cooling airflow of the other cases. The results suggest that in instances where the data center is a high-airflow, low-density, and open-aisle data center, knowing the precise IT airflow may not be critical to determining an efficient level of cooling airflow, but if the IT airflow rate is relatively low, then this information can be critical to identifying efficient cooling set points via simulation.

One or more of the methods and systems disclosed herein are also described in "Data Center Cooling Efficiency with Simulation-Based Optimization," ASME 2015 International Technical Conference and Exhibition on Packaging and Integration of Electronic and Photonic Microsystems, Volume 1: Thermal Management, Jul. 6-9, 2015, ISBN: 978-0-7918-5688-8, the entire disclosure of which is incorporated herein by reference.

Alternatives and Improvements

A first improvement to the simulation-based optimization methods discussed above includes the capability of turning one or more CRAHs off, which transforms the optimization problem into a mixed-integer type of nonlinear optimization problem. Several approaches using this feature may be considered, including one approach that solves in a first step the optimization problem corresponding to Strategy 1 (as discussed above in reference to Example 1), and then turning off one or more of the CRAH units to solve the optimization problem if one or more of the CRAH units reaches the lower temperature threshold. Another approach includes solving in a first step the optimization problem corresponding to Strategy 2, and if one or more of the CRAH units reaches the lower temperature threshold, then the optimization problem may be solved by turning the airflow of a first CRAH unit off, and if the lower temperature threshold is still reached, then the airflow of a second CRAH unit is turned off, and so forth.

Figure 10:
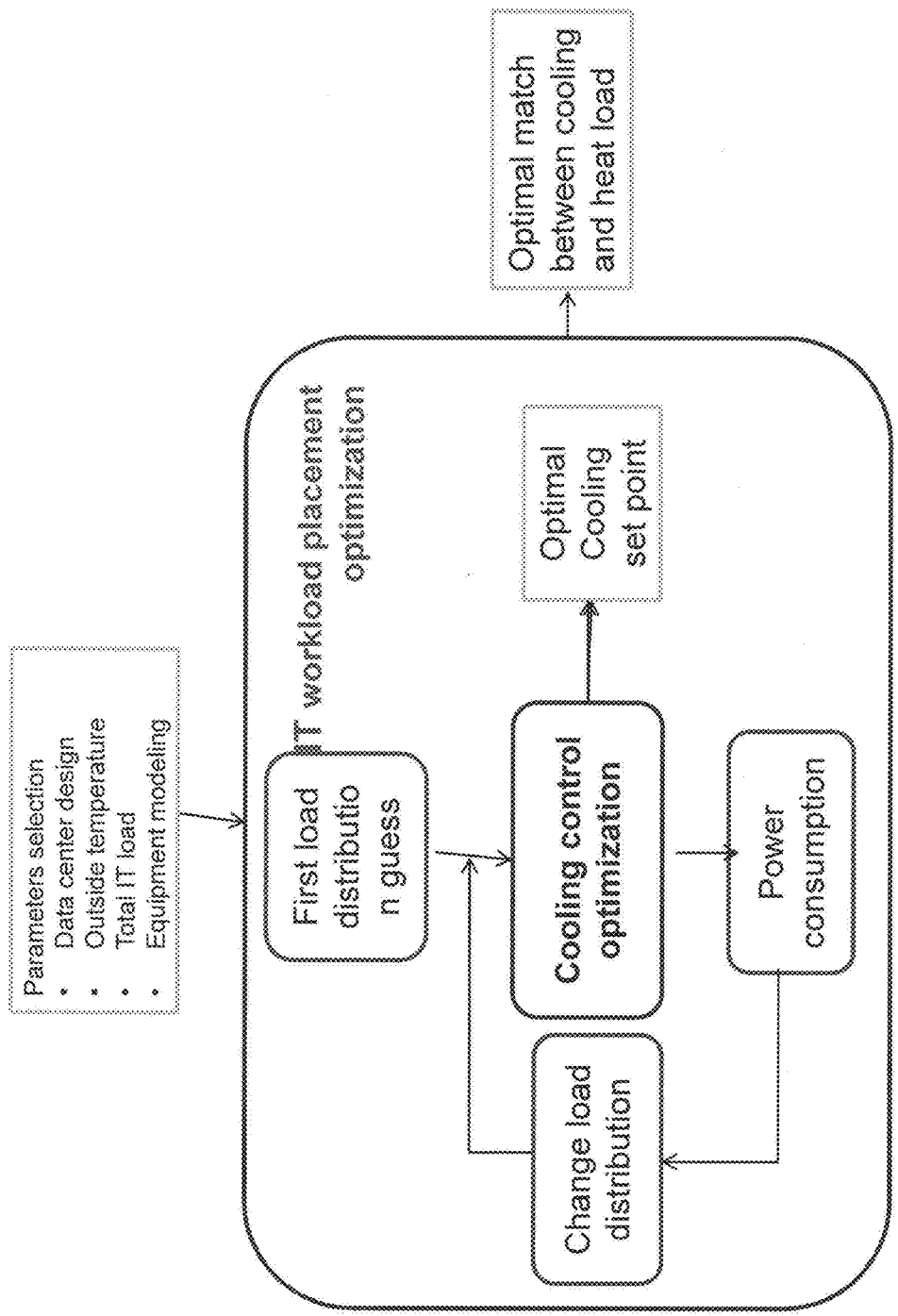
FIG. 10 is an example of workload placement in accordance with one or more aspects of the disclosure.

A second improvement includes a workload placement optimization routine. In general, workload placement and cooling control are interdependent, meaning that an optimal set point of the cooling system may no longer be optimal once the workload placement changes. Likewise, the optimal IT workload placement may change if the cooling set point changes. One of the purposes of optimizing the IT workload placement is to have the cooling match the heat load such that the cooling power consumption is minimized while still respecting restraints related to equipment safety and rack limitations. The difficulty may lie in finding the right coupling between load distribution and CRAH airflow distribution or cooling set point that is sufficiently fast enough to minimize the energy consumption. One way to solve this interdependency is to solve several cooling optimization control problems for different load distributions and then choose the coupling that performs the best. FIG. 10 illustrates an explicit scheme for handling workload distribution. The change in the load distribution may be performed using a deterministic free optimization solver or a deterministic solver with a derivative approximation. The problem formulation corresponding to this scheme is discussed further below.

As noted above, the primary goal in IT workload placement optimization is to minimize power consumption while assigning loads to racks, while also taking into account the total workload to be performed and individual rack capacity limitations. This relationship may be expressed below according to Equation 29:

Equation 29: $f(P_1, \ldots, P_i, \ldots, P_n)=\min \text{PowerConsumption}(Q^S, T^S, X)$, such that:

$\Sigma_{j-1}{}^n P_j = \text{Total } IT \text{ Load}$ $\underline{P_j} \leq P_j \leq \overline{P_j}$ for all racks Once a workload distribution has been chosen, an optimization problem, as explained further below, is performed to calculate the minimum power consumption that may be used with the particular load distribution. For a given workload placement, the cooling control optimization requires finding the control set point that minimizes the power consumption with respect to the maximum allowable rack inlet temperature and the equipment's range of operation. This particular formulation may take a long time to converge to solution since multiple cooling control optimization sub-models may have to be run in order to achieve a satisfactory solution. The use of Strategy 2, which includes the metamodeling approach, may serve to decrease the amount of time needed for this method to find an optimal match without losing precision.

Computer System

Various aspects and functions described herein, including the simulation-based optimization methodology discussed above, may be included as specialized hardware or software components executing in one or more computer systems. For example, one or more acts of the method described above may be performed with a computer, where at least one act is performed in a software program housed in a computer. Non-limiting examples of computer systems include, among others, network appliances, personal computers, workstations, mainframes, networked clients, servers, media servers, application servers, database servers and web servers. Other examples of computer systems may include mobile computing devices, such as cellular phones and personal digital assistants, and network equipment, such as load balancers, routers and switches. Further, aspects may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Consequently, examples are not limited to executing on any particular system or group of systems. Further, aspects and functions may be implemented in software, hardware or firmware, or any combination thereof. Thus, aspects and functions may be implemented within methods, acts, systems, system elements and components using a variety of hardware and software configurations, and examples are not limited to any particular distributed architecture, network, or communication protocol.

Figure 13:
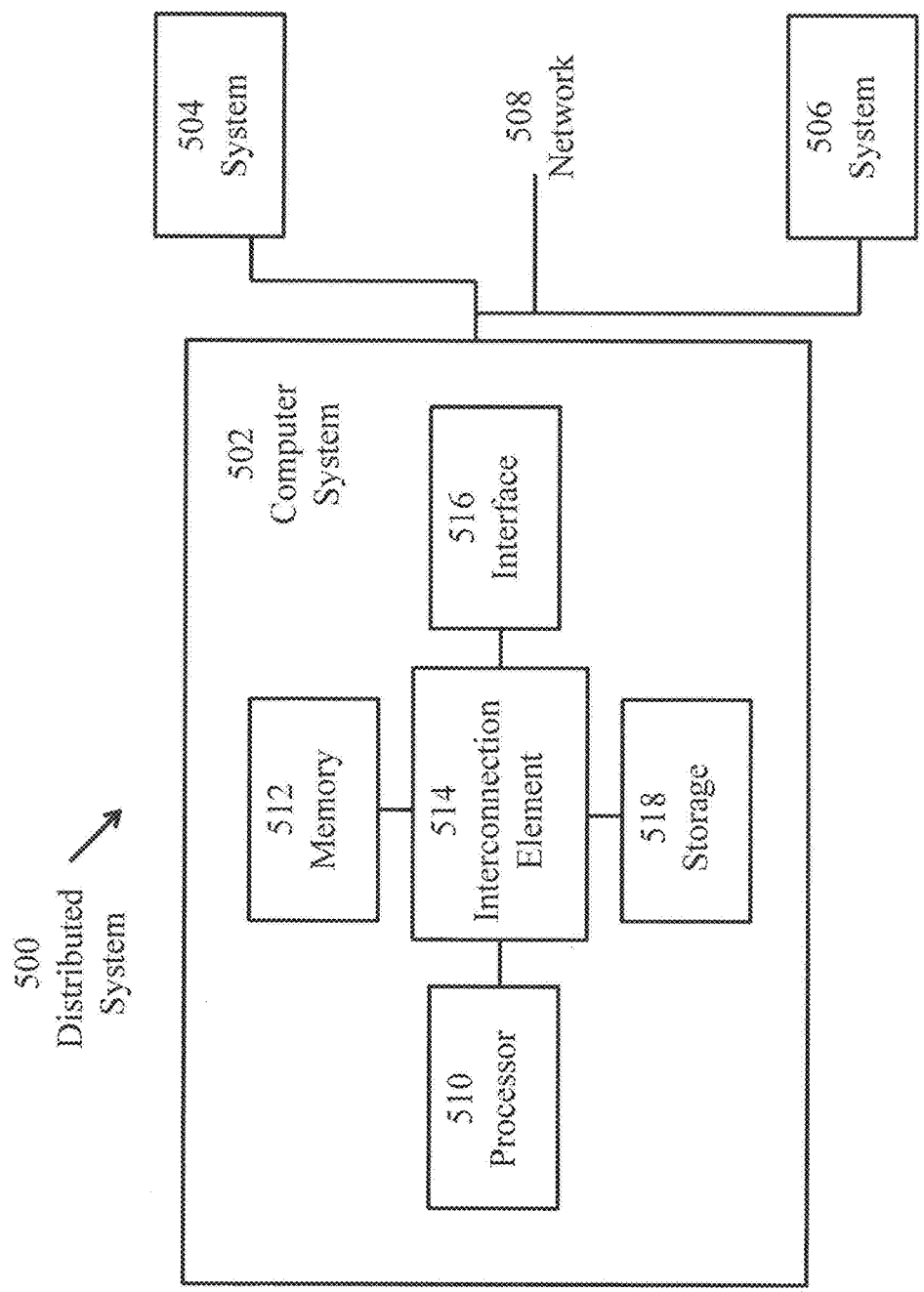
FIG. 13 is a block diagram of one example of a computer system that may be used to perform processes and functions disclosed herein.

Referring to FIG. 13, there is illustrated a block diagram of a distributed computer system 500, in which various aspects and functions are practiced. As shown, the distributed computer system 500 includes one or more computer systems that exchange information. More specifically, the distributed computer system 500 includes computer systems/devices 502, 504 and 506. As shown, the computer systems/devices 502, 504 and 506 are interconnected by, and may exchange data through, a communication network 508. The network 508 may include any communication network through which computer systems may exchange data. To exchange data using the network 508, the computer systems/devices 502, 504 and 506 and the network 508 may use various methods, protocols and standards, including, among others, Fibre Channel, Token Ring, Ethernet, Wireless Ethernet, Bluetooth, IP, IPV6, TCP/IP, UDP, DTN, HTTP, FTP, SNMP, SMS, MMS, SS7, JSON, SOAP, CORBA, REST and Web Services. To ensure data transfer is secure, the computer systems 502, 504 and 506 may transmit data via the network 508 using a variety of security measures including, for example, TLS, SSL or VPN. While the distributed computer system 500 illustrates three networked computer systems, the distributed computer system 500 is not so limited and may include any number of computer systems and computing devices, networked using any medium and communication protocol.

As illustrated in FIG. 13, the computer system 502 includes a processor 510, a memory 512, an interconnection element 514, an interface 516 and data storage element 518. To implement at least some of the aspects, functions and processes disclosed herein, the processor 510 performs a series of instructions that result in manipulated data. The processor 510 may be any type of processor, multiprocessor or controller. Some example processors include commercially available processors such as an Intel Atom, Itanium, Core, Celeron, or Pentium processor, an AMD Opteron processor, an Apple A4 or A5 processor, a Sun UltraSPARC or IBM Power5+ processor and an IBM mainframe chip. The processor 510 is connected to other system components, including one or more memory devices 512, by the interconnection element 514.

The memory 512 stores programs and data during operation of the computer system 502. Thus, the memory 512 may be a relatively high performance, volatile, random access memory such as a dynamic random access memory ("DRAM") or static memory ("SRAM"). However, the memory 512 may include any device for storing data, such as a disk drive or other nonvolatile storage device. Various examples may organize the memory 512 into particularized and, in some cases, unique structures to perform the functions disclosed herein. These data structures may be sized and organized to store values for particular data and types of data.

Components of the computer system 502 are coupled by an interconnection element such as the interconnection element 514. The interconnection element 514 may include one or more physical busses, for example, busses between components that are integrated within a same machine, but may include any communication coupling between system elements including specialized or standard computing bus technologies such as IDE, SCSI, PCI and InfiniBand. The interconnection element 514 enables communications, such as data and instructions, to be exchanged between system components of the computer system 502.

The computer system 502 also includes one or more interface devices 516 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow the computer system 502 to exchange information and to communicate with external entities, such as users and other systems.

The data storage element 518 includes a computer readable and writeable nonvolatile, or non-transitory, data storage medium in which instructions are stored that define a program or other object that is executed by the processor 510. The data storage element 518 also may include information that is recorded, on or in, the medium, and that is processed by the processor 510 during execution of the program. More specifically, the information may be stored in one or more data structures specifically configured to conserve storage space or increase data exchange performance. The instructions may be persistently stored as encoded signals, and the instructions may cause the processor 510 to perform any of the functions described herein. The medium may, for example, be optical disk, magnetic disk or flash memory, among others. In operation, the processor 510 or some other controller causes data to be read from the nonvolatile recording medium into another memory, such as the memory 512, that allows for faster access to the information by the processor 510 than does the storage medium included in the data storage element 518. The memory may be located in the data storage element 518 or in the memory 512, however, the processor 510 manipulates the data within the memory, and then copies the data to the storage medium associated with the data storage element 518 after processing is completed. A variety of components may manage data movement between the storage medium and other memory elements and examples are not limited to particular data management components. Further, examples are not limited to a particular memory system or data storage system.

Although the computer system 502 is shown by way of example as one type of computer system upon which various aspects and functions may be practiced, aspects and functions are not limited to being implemented on the computer system 502 as shown in FIG. 13. Various aspects and functions may be practiced on one or more computers having a different architectures or components than that shown in FIG. 13. For instance, the computer system 502 may include specially programmed, special-purpose hardware, such as an application-specific integrated circuit ("ASIC") tailored to perform a particular operation disclosed herein, while another example may perform the same function using one or a grid of several general-purpose computing devices running MAC OS X with IBM PowerPC processors and several specialized computing devices running proprietary hardware and operating systems. The computer system 502 may also be implemented using a general-purpose computer system that is programmable using a computer programming language.

The computer system 502 may be a computer system including an operating system that manages at least a portion of the hardware elements included in the computer system 502. In some examples, a processor or controller, such as the processor 510, executes an operating system. Examples of a particular operating system that may be executed include a Windows-based operating system, such as the Windows 8 operating system, available from the Microsoft Corporation, a MAC OS X operating system or an iOS operating system available from Apple Computer, one of many Linux-based operating system distributions, for example, the Enterprise Linux operating system available from Red Hat Inc., a Solaris operating system available from Sun Microsystems, or a UNIX operating systems available from various sources. Many other operating systems may be used, and examples are not limited to any particular operating system.

The processor 510 and operating system together define a computer platform for which application programs in high-level programming languages are written. These component applications may be executable, intermediate, bytecode or interpreted code which communicates over a communication network, for example, the Internet, using a communication protocol, for example, TCP/IP. Similarly, aspects may be implemented using an object-oriented programming language, such as .Net, SmallTalk, Java, C++, Ada, C# (C-Sharp), Python, or JavaScript. Other object-oriented programming languages may also be used. Alternatively, functional, scripting, or logical programming languages may be used.

Additionally, various aspects and functions may be implemented in a non-programmed environment, for example, documents created in HTML, XML or other format that, when viewed in a window of a browser program, can render aspects of a graphical-user interface or perform other functions. Further, various examples may be implemented as programmed or non-programmed elements, or any combination thereof. For example, a web page may be implemented using HTML while a data object called from within the web page may be written in C++ or Python. Thus, the examples are not limited to a specific programming language and any suitable programming language could be used. Accordingly, the functional components disclosed herein may include a wide variety of elements, e.g. specialized hardware, executable code, data structures or objects, which are configured to perform the functions described herein.

In some examples, the components disclosed herein may read parameters that affect the functions performed by the components. These parameters may be physically stored in any form of suitable memory including volatile memory (such as RAM) or nonvolatile memory (such as a magnetic hard drive). In addition, the parameters may be logically stored in a propriety data structure (such as a database or file defined by a user mode application) or in a commonly shared data structure (such as an application registry that is defined by an operating system). In addition, some examples provide for both system and user interfaces that allow external entities to modify the parameters and thereby configure the behavior of the components.

Having thus described several aspects of at least one example, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

What is claimed is:

1. A method for optimizing cooling power consumption in a data center including a plurality of racks and at least one cooling unit, the method comprising:
  receiving information regarding the data center, including a layout of the plurality of racks and the at least one cooling unit within the data center;
  determining an initial power consumption value for the data center by implementing an energy model;
  predicting at least one temperature value and at least one airflow rate value by implementing a numerical simulation model;
  defining constraints associated with operation of the at least one cooling unit, including maximum and minimum airflow rate values for the at least one cooling unit, maximum and minimum supply temperature values for the at least one cooling unit, and a maximum inlet temperature for each rack of the plurality of racks;
  determining at least one optimal cooling set point value for the at least one cooling unit using an optimization solver based on the initial power consumption value and the at least one predicted temperature value and the at least one predicted airflow rate value, the optimization solver minimizing a power consumption value of a power consumption function while maintaining the constraints associated with operation of the at least one cooling unit; and
  controlling operation of the at least one cooling unit using the at least one optimal cooling set point value.

2. The method of claim 1, wherein the optimization solver iteratively determines the at least one optimized cooling set point until a stopping condition is met by iteratively varying one or more inputs received by at least one of the energy model and the numerical simulation model.

3. The method of claim 2, further comprising reducing a number of iterations by averaging at least one input received by at least one of the energy model and the numerical simulation model.

4. The method of claim 2, further comprising:
dividing a representation of the data center into a computational grid comprising a plurality of grid cells;
determining an inlet temperature value for at least one grid cell of the plurality of grid cells, wherein the inlet temperature value is associated with an inlet temperature of at least one rack of the plurality of racks.

5. The method of claim 4, further comprising:
determining a lowest value for an inlet temperature value for the plurality of racks in each iteration;
averaging the lowest value associated with each iteration over the number of iterations to determine an average minimum inlet temperature for the plurality of racks;
determining a highest value for an inlet temperature for the plurality of racks in each iteration; and
averaging the highest value associated with each iteration over the number of iterations to determine an average maximum inlet temperature for the plurality of racks, wherein the constraints include the average minimum inlet temperature for the plurality of racks and the constraint associated with the maximum inlet temperature for each rack is replaced by the average maximum inlet temperature for the plurality of racks.

6. The method of claim 5, further comprising calculating an airflow velocity value and a temperature value for at least one grid cell, wherein the inlet temperature value is based on the airflow velocity value and the temperature value.

7. The method of claim 6, wherein the airflow velocity value and the temperature value are calculated using a potential flow method.

8. The method of claim 2, wherein the received information includes at least one real-time measurement value including at least one of rack power, rack airflow, cooler airflow, supply temperature of a cooler, and an outside temperature value, and the one or more inputs includes the at least one real-time measurement value.

9. The method of claim 2, further comprising statistically tuning at least one of the energy model and the numerical simulation model.

10. The method of claim 1, wherein implementing the numerical simulation model includes generating a regression model, the regression model based at least in part on at least one operating parameter of the data center, including a total load of the plurality of racks, an air ratio, and a supply temperature of the at least one cooling unit.

11. The method of claim 10, wherein the regression model is generated using a least square regression technique.

12. A system for optimizing cooling power consumption in a data center including a plurality of racks and at least one cooling unit, the system comprising:
at least one input configured to receive information regarding the data center, including a layout of the plurality of racks and the at least one cooling unit within the data center;
a programmable device in communication with the at least one input, the programmable device comprising:
a memory for storing the received information;
at least one processor coupled to the memory and configured to:
determine an initial power consumption value for the data center by implementing an energy model;
predict at least one temperature value and at least one airflow rate value by implementing a numerical simulation model;
define constraints associated with operation of the at least one cooling unit, including maximum and minimum airflow rate values for the at least one cooling unit, maximum and minimum supply temperature values for the at least one cooling unit, and a maximum inlet temperature for each rack of the plurality of racks;
determine at least one optimal cooling set point value for the at least one cooling unit using an optimization solver based on the initial power consumption value and the at least one predicted temperature value and the at least one predicted airflow rate value, the optimization solver minimizing a power consumption value of a power consumption function while maintaining the constraints associated with operation of the at least one cooling unit; and
control operation of the at least one cooling unit using the at least one optimal cooling set point value.

13. The system of claim 12, wherein the at least one processor is configured to use the optimization solver by iteratively determining the at least one optimized cooling set point until a stopping condition is met by iteratively varying one or more inputs used by at least one of the energy model and the numerical simulation model.

14. The system of claim 13, wherein the at least one processor is configured to:
divide a representation of the data center into a computational grid comprising a plurality of grid cells;
determine an inlet temperature value for at least one grid cell of the plurality of grid cells, wherein the inlet temperature value is associated with an inlet temperature of at least one rack of the plurality of racks.

15. The system of claim 14, wherein the at least one processor is configured to:
determine a lowest value for an inlet temperature value for the plurality of racks in each iteration;
average the lowest value associated with each iteration over the number of iterations to determine an average minimum inlet temperature for the plurality of racks;
determine a highest value for an inlet temperature for the plurality of racks in each iteration; and
average the highest value associated with each iteration over the number of iterations to determine an average maximum inlet temperature for the plurality of racks, wherein the constraints include the average minimum inlet temperature for the plurality of racks and the constraint associated with the maximum inlet temperature for each rack is replaced by the average maximum inlet temperature for the plurality of racks.

16. The system of claim 13, wherein the received information includes at least one real-time measurement value including at least one of rack power, rack airflow, cooler airflow, supply temperature of a cooler, and an outside temperature value, and the one or more inputs includes the at least one real-time measurement value.

17. The system of claim 13, wherein the at least one processor is configured to statistically tune at least one of the energy model and the numerical simulation model.

18. The system of claim 13, wherein the at least one processor is configured to implement the numerical simulation model by generating a regression model, the regression model based at least in part on at least one operating parameter of the data center, including a total load of the plurality of racks, an air ratio, and a supply temperature of the at least one cooling unit.

* * * * *